(12) United States Patent
Ku et al.

(10) Patent No.: US 10,693,034 B2
(45) Date of Patent: Jun. 23, 2020

(54) METHOD OF SELECTIVELY TRANSFERRING SEMICONDUCTOR DEVICE

(71) Applicant: EPISTAR CORPORATION, Hsinchu (TW)

(72) Inventors: Hao-Min Ku, Hsinchu (TW); You-Hsien Chang, Hsinchu (TW); Shih-I Chen, Hsinchu (TW); Fu-Chun Tsai, Hsinchu (TW); Hsin-Chih Chiu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 32 days.

(21) Appl. No.: 15/683,041

(22) Filed: Aug. 22, 2017

(65) Prior Publication Data

US 2017/0373219 A1 Dec. 28, 2017

Related U.S. Application Data

(63) Continuation-in-part of application No. 15/295,226, filed on Oct. 17, 2016, now Pat. No. 10,553,747.
(Continued)

(51) Int. Cl.
*H01L 21/683* (2006.01)
*H01L 33/62* (2010.01)
*H01L 33/00* (2010.01)

(52) U.S. Cl.
CPC ...... *H01L 33/0079* (2013.01); *H01L 21/6835* (2013.01); *H01L 21/6836* (2013.01);
(Continued)

(58) Field of Classification Search
None
See application file for complete search history.

(56) References Cited

U.S. PATENT DOCUMENTS

| 5,073,230 | A | 12/1991 | Maracas |
| 2007/0111473 | A1 | 5/2007 | Furukawa |

(Continued)

FOREIGN PATENT DOCUMENTS

| CN | 101262118 A | 9/2008 |
| CN | 103038902 A | 4/2013 |

(Continued)

*Primary Examiner* — Alexander G Ghyka
(74) *Attorney, Agent, or Firm* — Muncy, Geissler, Olds & Lowe, P.C.

(57) ABSTRACT

A method of transferring multiple semiconductor devices from a first substrate to a second substrate comprises the steps of forming the multiple semiconductor devices adhered on the first substrate, wherein the multiple semiconductor devices comprises a first semiconductor device and a second semiconductor device, and the first semiconductor device and the second semiconductor device have a first gap between thereof; separating the first semiconductor device and the second semiconductor device from the first substrate; sticking the first semiconductor device and the second semiconductor device to a surface of the second substrate, wherein the first semiconductor device and the second semiconductor device have a second gap between thereof; wherein the first gap and the second gap are different.

18 Claims, 34 Drawing Sheets

Related U.S. Application Data which is a continuation of application No. 14/908,886, filed as application No. PCT/CN2013/080335 on Jul. 29, 2013, now Pat. No. 9,508,894.

(52) U.S. Cl.
CPC .......... *H01L 33/0095* (2013.01); *H01L 33/62* (2013.01); *H01L 2221/68318* (2013.01); *H01L 2221/68363* (2013.01); *H01L 2221/68381* (2013.01); *H01L 2933/0066* (2013.01)

(56) References Cited

U.S. PATENT DOCUMENTS

| | | | |
|---|---|---|---|
| 2008/0121724 A1* | 5/2008 | Beer | G06K 19/07718 235/492 |
| 2009/0239354 A1 | 9/2009 | Suzawa | |
| 2010/0330506 A1 | 12/2010 | Knechtel | |
| 2011/0294281 A1 | 12/2011 | Zang et al. | |
| 2012/0055532 A1 | 3/2012 | Wang et al. | |
| 2012/0256327 A1* | 10/2012 | Kadowaki | H01L 33/0079 257/798 |
| 2013/0020681 A1 | 1/2013 | Furukawa | |
| 2014/0342479 A1 | 11/2014 | Marchena | |
| 2015/0083202 A1 | 3/2015 | Ghyselen | |
| 2015/0177458 A1 | 6/2015 | Bowers | |
| 2016/0155894 A1 | 6/2016 | Huang | |

FOREIGN PATENT DOCUMENTS

| | | |
|---|---|---|
| JP | 4288947 B2 | 7/2009 |
| KR | 20060049302 A | 5/2006 |
| TW | 200739759 A | 10/2007 |
| TW | 200739759 A | 10/2007 |
| TW | 201212279 A | 3/2012 |
| TW | 201232811 A | 8/2012 |

* cited by examiner

METHOD OF SELECTIVELY TRANSFERRING SEMICONDUCTOR DEVICE

RELATED APPLICATION DATA

This present application is a continuation-in-part of U.S. patent application Ser. No. 15/295,226, filed Oct. 17, 2016, which is a continuation application of U.S. patent application Ser. No. 14/908,886, filed Jan. 29, 2016, which is national stage entry according to 35 U.S.C. § 371 of PCT Application No. PCT/CN2013/080335, Publication No. 2015/013864, filed on Jul. 29, 2013, and is incorporated herein by reference in its entirety.

TECHNICAL FIELD

The application is related to a method of transferring semiconductor devices, particularly related to a method of transferring mass optoelectronic semiconductor devices.

DESCRIPTION OF BACKGROUND ART

As technology developed, optoelectronic semiconductor devices have contributed a lot to energy transmission and conversion. For example, optoelectronic semiconductor devices can be used in system operation such as optical fiber communication system, optical storage system, and military system. According to the energy conversion mode, optoelectronic semiconductor devices can be classified as three categories: conversion from electrical power to light such as light-emitting diode and laser diode; conversion from light to electrical signal such as optical detector; and conversion from light into electrical power such as solar cell.

Growth substrate is important for forming an optoelectronic semiconductor device. Semiconductor epitaxial structure of the optoelectronic semiconductor device is formed on and supported by the growth substrate. Therefore, the quality of the optoelectronic semiconductor device is determined by a suitable growth substrate.

However, a suitable growth substrate sometimes is not suited to be a support substrate for the optoelectronic semiconductor device. For example, in order to obtain a high-quality semiconductor epitaxial structure for a light-emitting diode that can emit red light, the opaque GaAs substrate is usually preferred as the growth substrate for its lattice constant is the most close to that of the semiconductor epitaxial structure for red light-emitting diode. But, as the light-emitting diode is used for emitting light, the opaque growth substrate blocks the light and therefore decreases the light-emitting efficiency of the light-emitting diode in operation.

In order to satisfy the different conditions of the growth substrate and the support substrate required for different optoelectronic semiconductor devices, the technique of transferring substrate is developed. To be more specific, the semiconductor epitaxial structure is firstly formed on the growth substrate and then the semiconductor epitaxial structure is transferred to the support substrate. After the support substrate is bonded with the semiconductor epitaxial structure, the removal of the growth substrate is the key technique in the process of substrate transfer.

The method of removing the growth substrate mainly comprises dissolving method such as wet etching, physical method such as polishing and cutting, or the method of forming a sacrificial layer between the semiconductor epitaxial structure and the growth substrate in advance and then removing the sacrificial layer by etching. However, both of the wet etching method and the physical method such as polishing and cutting, damage the growth substrate. Furthermore, considering the importance of the environmental protection and the energy conservation, it is wasteful if the growth substrate cannot be reused.

SUMMARY OF THE DISCLOSURE

A method of transferring multiple semiconductor devices from a first substrate to a second substrate comprises the steps of forming the multiple semiconductor devices adhered on the first substrate, wherein the multiple semiconductor devices comprises a first semiconductor device and a second semiconductor device, and the first semiconductor device and the second semiconductor device have a first gap between thereof; separating the first semiconductor device and the second semiconductor device from the first substrate; sticking the first semiconductor device and the second semiconductor device to a surface of the second substrate, wherein the first semiconductor device and the second semiconductor device have a second gap between thereof; wherein the first gap and the second gap are different.

DETAILED DESCRIPTION OF PREFERRED EMBODIMENTS

First Embodiment

Figure 1A:
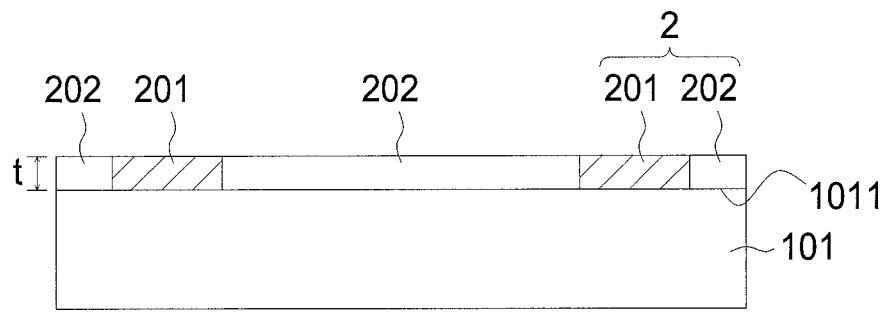
FIGS. 1A to 1I show the structures corresponding to the steps of a manufacturing process according to the first embodiment.
Figure 1B:
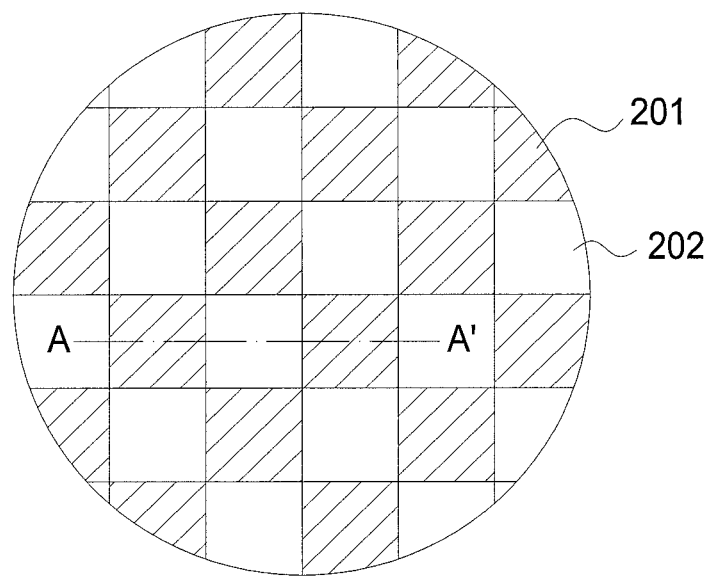

FIGS. 1A to 1I show the structures corresponding to the steps of a manufacturing process according to the first embodiment. FIG. 1A shows the cross-sectional diagram along the dotted line AA' of FIG. 1B. According to the process for manufacturing the optoelectronic device disclosed in the embodiment of the application, an adhesion substrate 101 with a surface 1011 is provided, and an adhesion structure 2 is formed on the surface 1011, wherein the adhesion structure 2 has a thickness t. In this embodiment, the thickness t is between 2 μm and 6 μm. The adhesion structure 2 comprises an adhesion layer 202 and a sacrificial layer 201, wherein the adhesion layer 202 and the sacrificial layer 201 are formed side by side on the surface 1011 and connect to the surface 1011. FIG. 1B shows the top view of the adhesion structure 2, and each of the adhesion layer 202 and the sacrificial layer 201 has a specific shape. The adhesion substrate 101 comprises an electrically-insulated substrate or an electrically-conductive substrate. The material of electrically-insulated substrate comprises sapphire, diamond, glass, quartz, acryl, $LiAlO_2$ or ceramics; the material of electrically-conductive substrate comprises semiconductor such as Si, GaAs, SiC, GaN and AlN, oxide such as ZnO, metal, or the combination thereof. In this embodiment, the materials of the adhesion layer 202 and the sacrificial layer 201 are different. The material of the adhesion layer 202 comprises BCB. The material of the sacrificial layer 201 comprises organic material or inorganic material, wherein the organic material comprises UV dissociated glue or thermoplastic material, and the inorganic material comprises metal, oxide, or nitride, wherein the UV dissociated glue comprises acrylic acid, unsaturated polyester, epoxy, oxetane or vinyl ether, the thermoplastic comprises nylon, PP, PBT, PPO, PC, ABS or PVC, the metal comprises Ti, Au, Be, W, Al or Ge, the oxide comprises $SiO_x$, and the nitride comprises $SiN_x$.

Figure 1C:
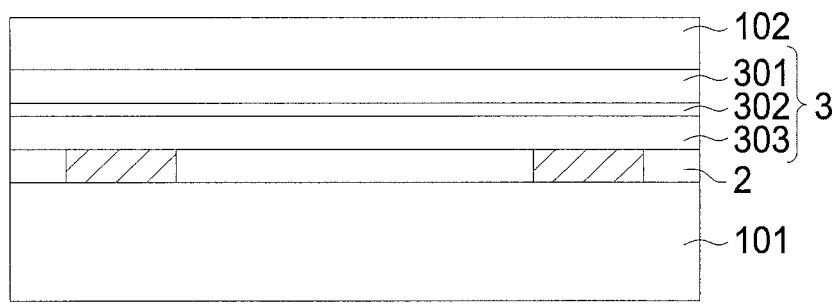

As shown in FIG. 1C, a growth substrate 102 is provided and a semiconductor epitaxial stack 3 is formed on the growth substrate 102 by epitaxial growth. Then, the growth substrate 102 and the semiconductor epitaxial stack 3 are adhered to the surface 1011 of the adhesion substrate 101 through the adhesion structure 2 by heating and pressing method, wherein both of the adhesion layer 202 and the sacrificial layer 201 contact the semiconductor epitaxial stack 3. Because the materials of the adhesion layer 202 and the sacrificial layer 201 are different, the adhesion between the adhesion layer 202 and the semiconductor epitaxial stack 3 is different from the adhesion between the sacrificial layer 201 and the semiconductor epitaxial stack 3. In this embodiment, the adhesion between the adhesion layer 202 and the semiconductor epitaxial stack 3 is larger than the adhesion between the sacrificial layer 201 and the semiconductor epitaxial stack 3.

The semiconductor epitaxial stack 3 comprises a first semiconductor layer 301 having a first type conductivity, a converting unit 302, and a second semiconductor layer 303 having a second type conductivity sequentially formed on the growth substrate 102. The first semiconductor layer 301 and the second semiconductor layer 303 both are single-layer structure or multi-layer structure (multi-layer means two or more than two layers). The first semiconductor layer 301 and the second semiconductor layer 303 have different conductive types, different electrical types and different polarities, or are doped with different elements for providing electrons or holes. When the first semiconductor layer 301 is p-type semiconductor, the second semiconductor layer 303 is n-type semiconductor, of which the electrical type is different from that of the p-type semiconductor. On the contrary, when the first semiconductor layer 301 is n-type semiconductor, the second semiconductor layer 303 is p-type semiconductor. The converting unit 302 is formed between the first semiconductor layer 301 and the second semiconductor layer 303. The converting unit 302 is able to mutually convert light into electrical power or electrical power into light. The semiconductor epitaxial stack 3 can be further adopted in a semiconductor device, equipment, product or circuit for mutually converting light into electrical power or electrical power into light. Specifically, the semiconductor epitaxial stack 3 can further form a light-emitting diode (LED), a laser diode (LD), a solar cell or be adopted in a display. Taking the light-emitting diode (LED) as an example, the wavelength of the emitted light can be adjusted by adjusting the combination of one layer or multiple layers of the semiconductor epitaxial stack 3. The material of the semiconductor epitaxial stack 3 comprises aluminum gallium indium phosphide (AlGaInP) series, aluminum gallium indium nitride (AlGaInN) series or zinc oxide (ZnO) series. The structure of the converting unit 302 comprises single heterostructure (SH), double heterostructure (DH), double-side double heterostructure (DDH) or multi-quantum well (MWQ). Specifically, the converting unit 302 can be intrinsic, p-type or n-type semiconductor. When an electrical current passes through the semiconductor epitaxial stack 3, the converting unit 302 is able to emit a light. As the converting unit 302 is made of aluminum gallium indium phosphide (AlGaInP) series, the light emitted from the converting unit 302 is amber series such as red, orange and yellow. As the converting unit 302 is made of aluminum gallium indium nitride (AlGaInN) series, the light emitted from the converting unit 302 is blue or green.

Figure 1D:
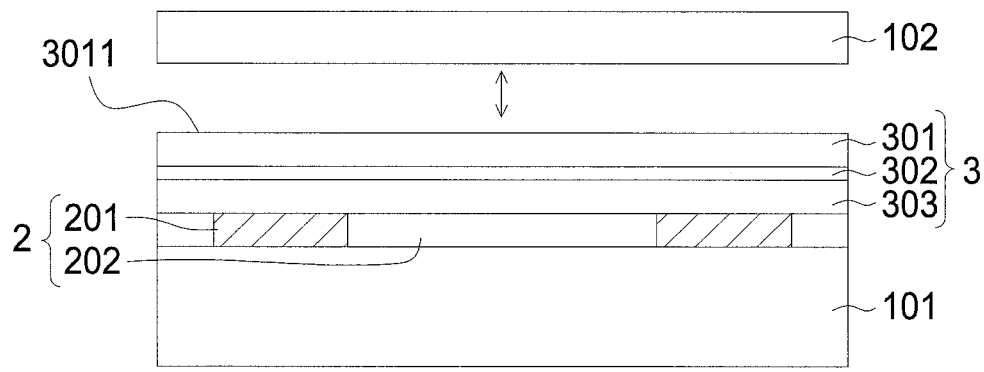

In the next step, as shown in FIG. 1D, the growth substrate 102 is separated from the semiconductor epitaxial stack 3 and a surface 3011 of the semiconductor epitaxial stack 3 is exposed. The method of separating the growth substrate 102 comprises irradiation method which uses a laser to penetrate the growth substrate 102 and to irradiate the interface between the growth substrate 102 and the semiconductor epitaxial stack 3 for separating the semiconductor epitaxial stack 3 from the growth substrate 102. In addition, wet etching method can be applied to directly remove the growth substrate 102 or remove an interlayer (not shown) between the growth substrate 102 and the semiconductor epitaxial stack 3 for separating the semiconductor epitaxial stack 3 and the growth substrate 102. Besides, the interlayer between the growth substrate 102 and the semiconductor epitaxial stack 3 can be removed by using vapor etch method in high temperature for separating the semiconductor epitaxial stack 3 and the growth substrate 102.

Figure 1E:
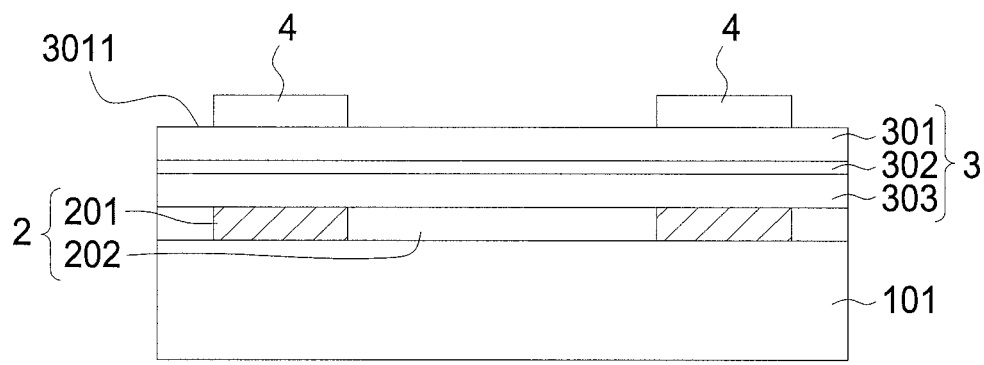

As shown in FIG. 1E, a patterned adhesion medium 4 corresponding to the sacrificial layer 201 is formed on the surface 3011 of the semiconductor epitaxial stack 3, wherein the method of forming the patterned adhesion medium 4 comprises forming a layer of adhesion medium on the surface 3011 and then using photolithography method or etching method to pattern the layer of adhesion medium to form the patterned adhesion medium 4, wherein the photolithography method and the patterned etching method are general semiconductor producing processes. The material of the patterned adhesion medium 4 comprises organic material or inorganic material, wherein the organic material comprises acrylic acid, unsaturated polyester, epoxy, oxetane, vinyl ether, nylon, PP, PBT, PPO, PC, ABS, PVC or BCB, and the inorganic material comprises metal such as Ti, Au, Be, W, Al, Ge, Cu and combination thereof, oxide such as ITO, CTO, ATO, IZO, AZO, ZTO, ZnO and $SiO_x$, or nitride such as $SiN_x$.

Figure 1F:
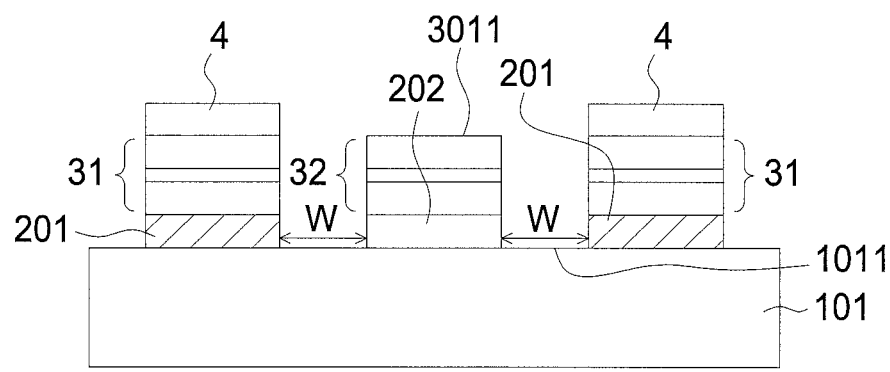

In the next step, as shown in FIG. 1F, the semiconductor epitaxial stack 3 and the adhesion structure 2 are patterned to reveal the surface 1011, so a plurality of semiconductor epitaxial stacks is formed, wherein the multiple semiconductor epitaxial stacks are separated. The multiple semiconductor epitaxial stacks comprise a first semiconductor epitaxial stack 31 and a second semiconductor epitaxial stack 32, wherein the first semiconductor epitaxial stack 31 has the adhesion medium 4 thereon and the second semiconductor epitaxial stack 32 has no the adhesion medium 4 on the surface 3011. The method of patterning the semiconductor epitaxial stack 3 and the adhesion structure 2 comprises wet etching or dry etching. In this embodiment, dry etching method is applied to make an interval w between the first semiconductor epitaxial stack 31 and the second semiconductor epitaxial stack 32 as small as possible to prevent epitaxial stack of the semiconductor epitaxial stack 3 from being removed excessively. In this embodiment, the interval w is between 1 μm and 10 μm, or preferably about 5 μm.

Figure 1G:
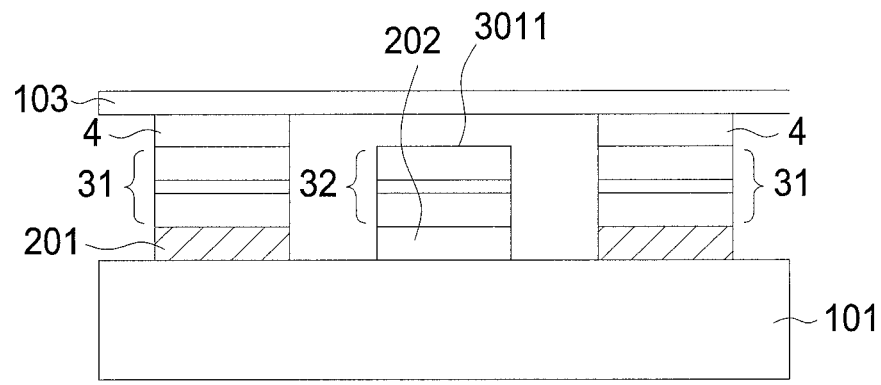
Figure 11A:
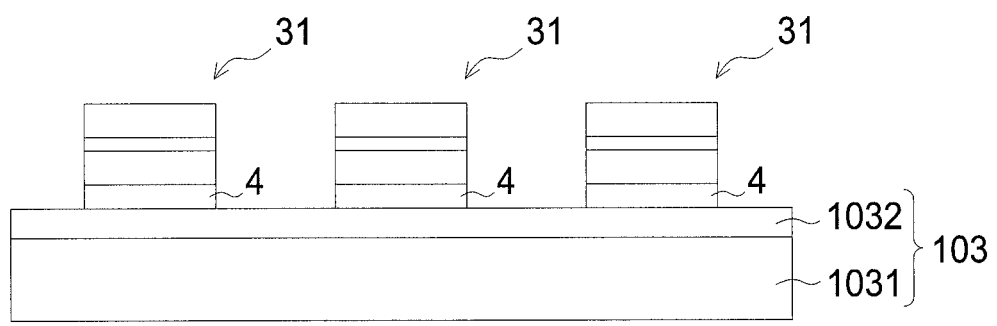
FIGS. 11A to 11B show the structures corresponding to the steps of a manufacturing process according to one embodiment.

In the next step, as shown in FIG. 1G, a picking unit 103 is provided to stick to the adhesion medium 4 by heating, pressing, or using stickiness of the picking unit 103. The picking unit 103 comprises electrically-conductive material such as electrically-conductive substrate and printed circuit board, wherein the electrically-conductive substrate comprises semiconductor such as Si, GaAs, GaN, AlN and SiC; oxide such as ZnO; metal; or the combination thereof, and the printed circuit board comprises single-sided printed circuit board, double-sided printed circuit board, multi-layer printed circuit board, or flexible printed circuit board; or electrically-insulated material such as sapphire, diamond, glass, quartz, acryl, AlN, $LiAlO_2$, ceramics and EPS tape. When the EPS tape is used as the picking unit 103, it is necessary to provide a hard substrate to stick with the EPS tape for supporting the EPS tape and preventing the EPS tape from sticking the surface 3011 of the second semiconductor epitaxial stack 32. In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN), or polyimide (PI), and the supporting structure 1031 comprises hard substrate such as sapphire, diamond, glass, quartz and acryl, for supporting the flexible substrate 1032.

In another embodiment, the patterned adhesion medium 4 is able to be formed on the picking unit 103 in advance. Then, the alignment bonding technology is applied to align the adhesion medium 4 and the first semiconductor epitaxial stack 31 firstly and then bond the adhesion medium 4 and the first semiconductor epitaxial stack 31 by heating and pressing.

Figure 1H:
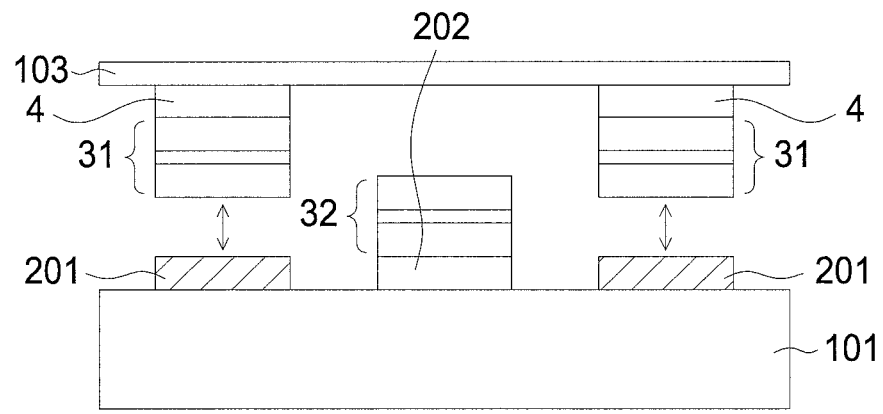

In the next step, as shown in FIG. 1H, when the adhesion between the sacrificial layer 201 and the first semiconductor epitaxial stack 31 is smaller than the adhesion between the adhesion medium 4 and the first semiconductor epitaxial stack 31, the forces in the opposite directions can be directly applied on the picking unit 103 and the adhesion substrate 101 respectively to separate the first semiconductor epitaxial stack 31 and the sacrificial layer 201 for preventing the structure of the first semiconductor epitaxial stack 31 from being damaged. For example, when the material of the sacrificial layer 201 is UV dissociated material comprising acrylic acid, unsaturated polyester, epoxy, oxetane, or vinyl ether, the stickiness of the sacrificial layer 201 can be reduced by the irradiation on the sacrificial layer 201 by UV light, and then the forces in the opposite directions are directly applied on the picking unit 103 and the adhesion substrate 101 respectively to separate the first semiconductor epitaxial stack 31 and the sacrificial layer 201. When the material of the sacrificial layer 201 is thermoplastic comprising nylon, PP, PBT, PPO, PC, ABS, or PVC, the stickiness of the sacrificial layer 201 can be reduced by heating, and then the forces in the opposite directions are directly applied on the picking unit 103 and the adhesion substrate 101 respectively to separate the first semiconductor epitaxial stack 31 and the sacrificial layer 201. When the adhesion medium 4 is made of the material with high stickiness such as BCB, and the sacrificial layer 201 is made of the material with low stickiness, the first semiconductor epitaxial stack 31 and the sacrificial layer 201 can be separated by directly applying the forces in the opposite directions on the picking unit 103 and the adhesion substrate 101 without heating or irradiating the sacrificial layer 201. The material with low stickiness comprises metal such as Ti, Al and TiW, oxide such as SiOx, or nitride such as SiNx.

Figure 1I:
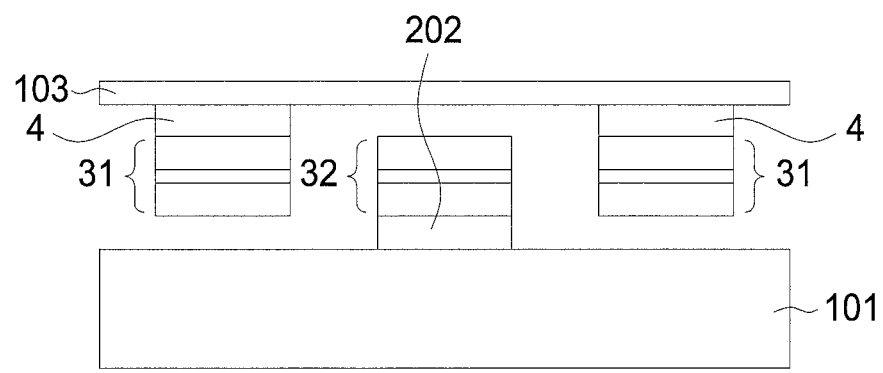

Besides, as shown in FIG. 1I, when the material of the sacrificial layer 201 comprises metal such as Ti, Al, TiW and Ag, or the material with Si such as SiOx, SiNx and poly-Si, the sacrificial layer 201 can be removed by wet etching or vapor etching, and then the forces in the opposite directions are directly applied on the picking unit 103 and the adhesion substrate 101 respectively to separate the first semiconductor epitaxial stack 31 and the sacrificial layer 201. In this embodiment, the etchant used in the wet etching process comprises hydrofluoric (HF) acid, and the chemical material used in the vapor etching process comprises hydrofluoric (HF) vapor.

Figure 11B:
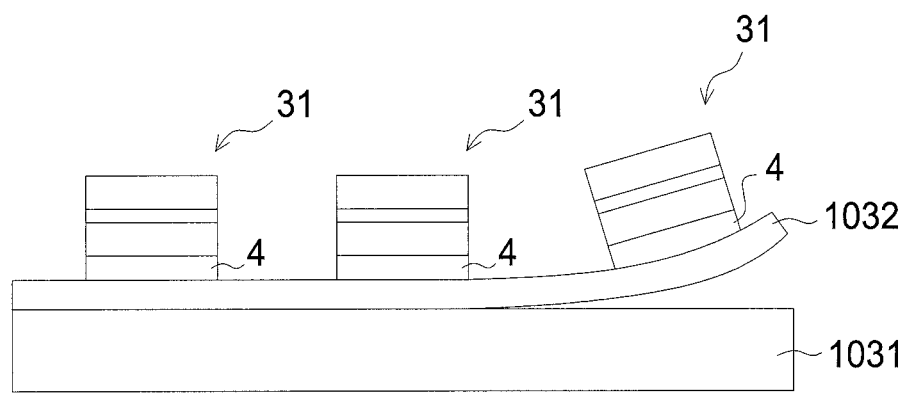

In another embodiment, as mentioned above, the picking unit 103 comprises the flexible substrate 1032 and the supporting structure 1031. After the first semiconductor epitaxial stack 31 is separated from the sacrificial layer 201, the flexible substrate 1032 and the supporting structure 1031 are able to be separated to form a flexible display as shown in FIG. 11B.

Second Embodiment

Figure 2A:
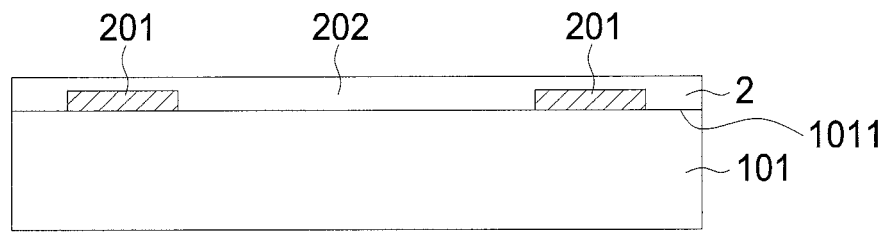
FIGS. 2A to 2H show the structures corresponding to the steps of a manufacturing process according to the second embodiment.
Figure 2B:
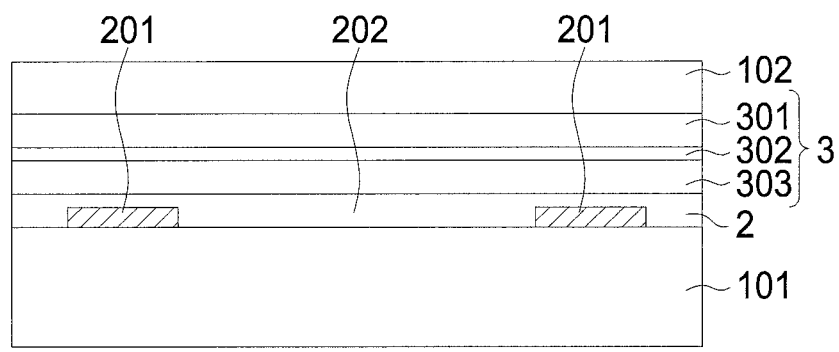
Figure 2C:
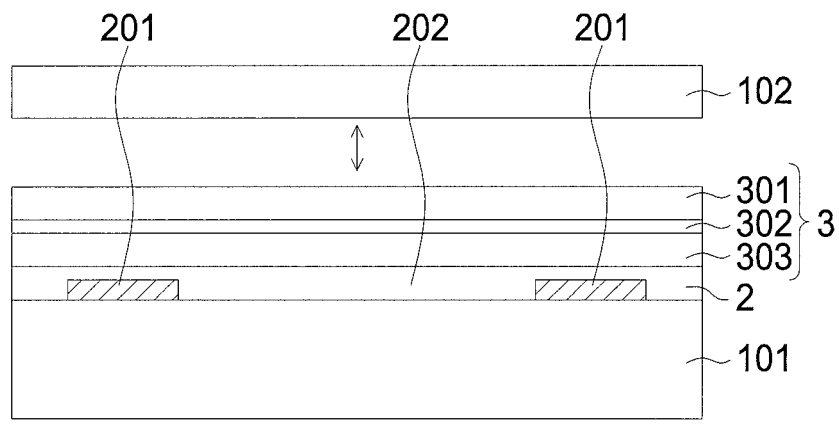
Figure 2D:
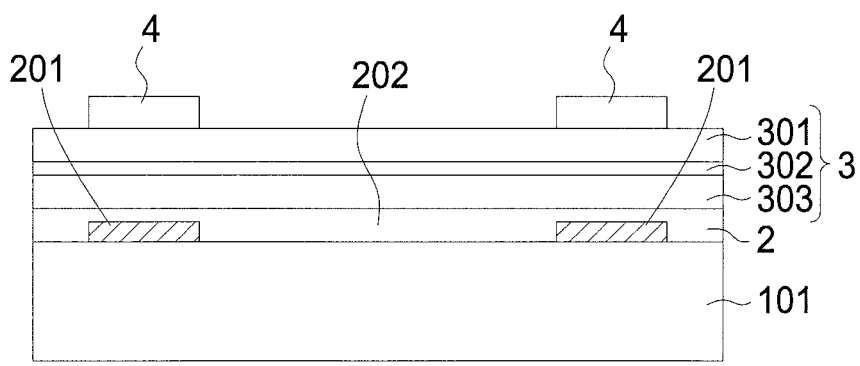
Figure 2E:
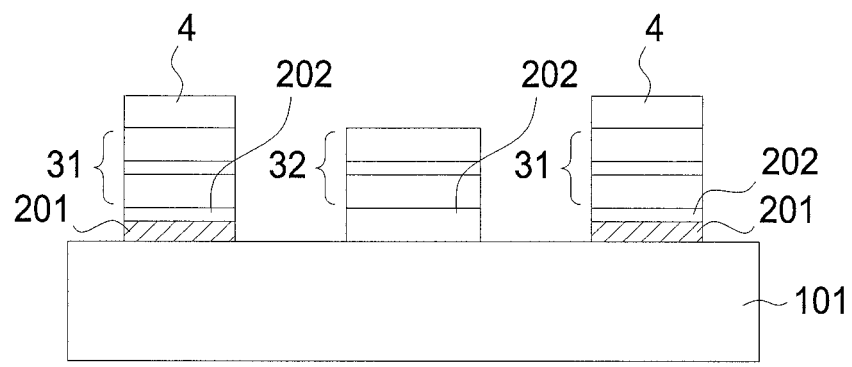
Figure 2F:
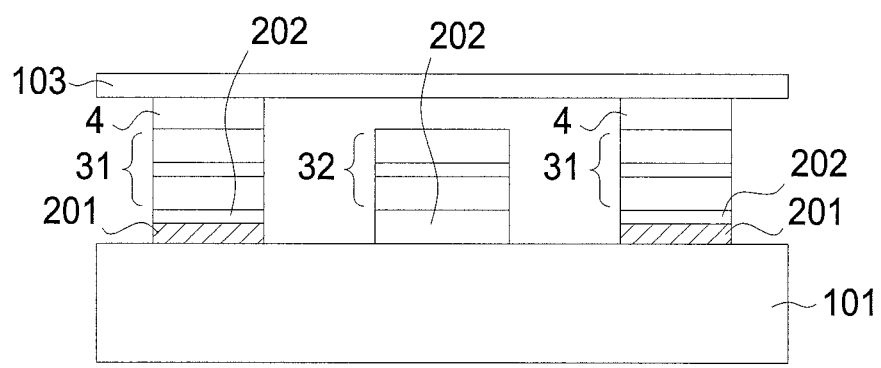
Figure 2G:
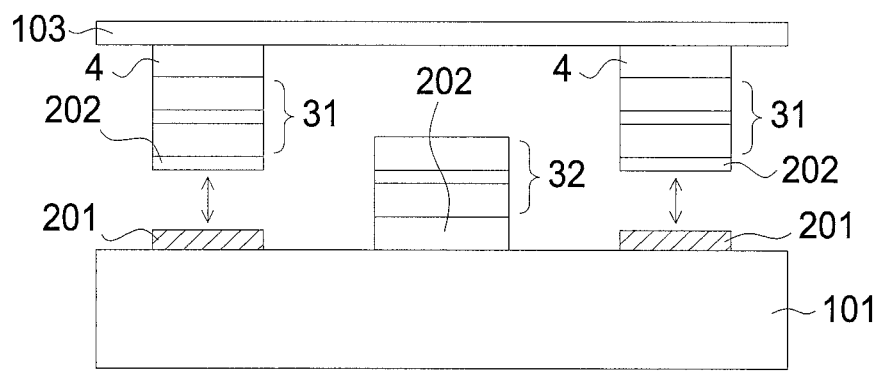
Figure 2H:
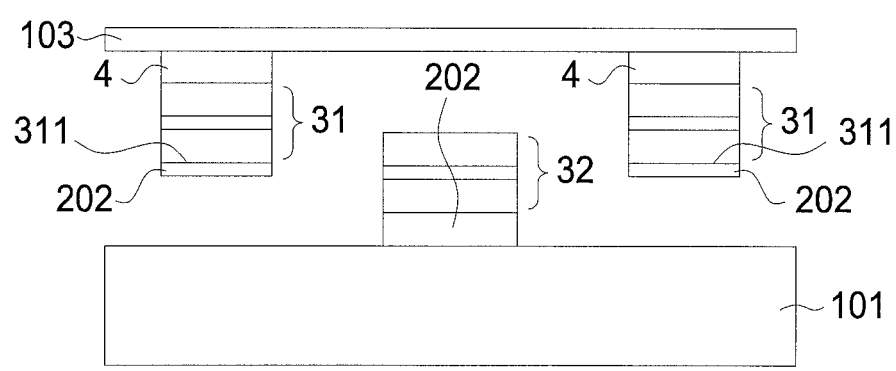

FIGS. 2A to 2H show the structures corresponding to the steps of a manufacturing process according to the second embodiment. As shown in FIG. 2A, the difference between this embodiment and the first embodiment lies in the structure of the adhesion structure 2. In this embodiment, the sacrificial layer 201 is between the surface 1011 of the adhesion substrate 101 and the adhesion layer 202. Though the other processes shown in FIGS. 2B to 2H are the same as the first embodiment, after the first semiconductor epitaxial stacks 31 are formed by the process disclosed in this embodiment, each of the first semiconductor epitaxial stacks 31 has the adhesion layer 202 on a surface 311 of each of the first semiconductor epitaxial stacks 31.

Third Embodiment

Figure 3A:
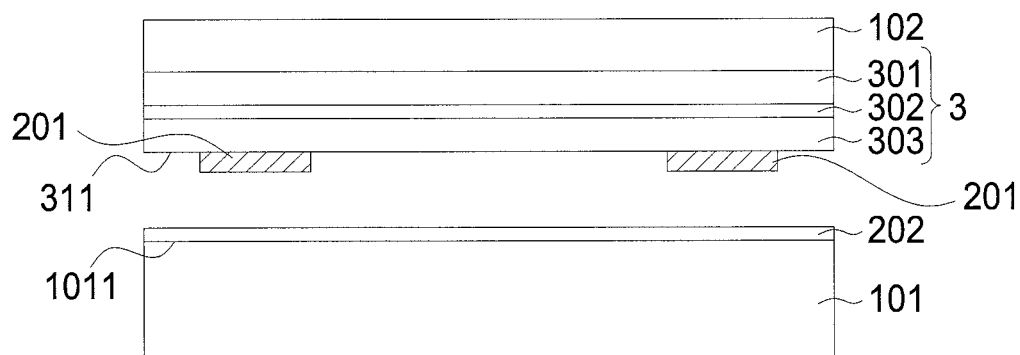
FIGS. 3A to 3H show the structures corresponding to the steps of a manufacturing process according to the third embodiment.
Figure 3B:
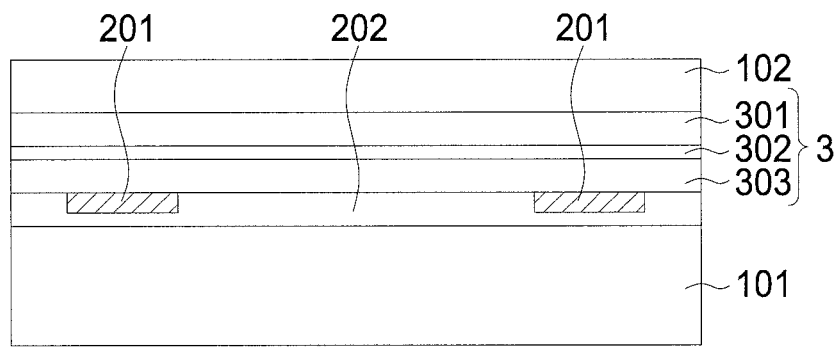
Figure 3C:
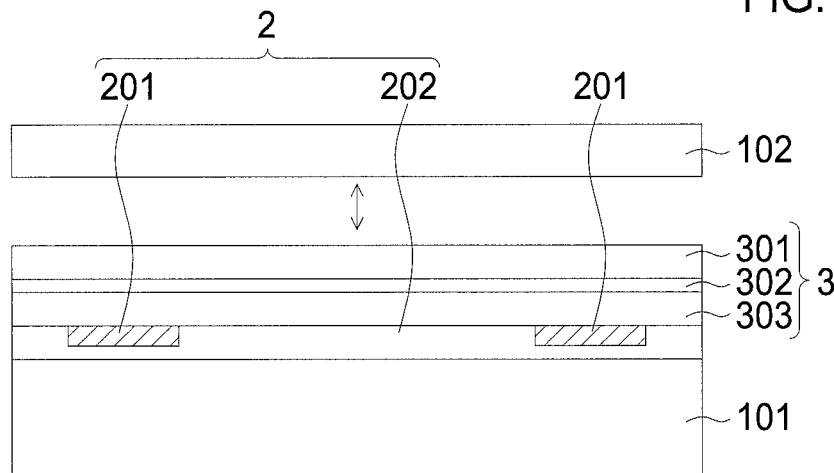
Figure 3D:
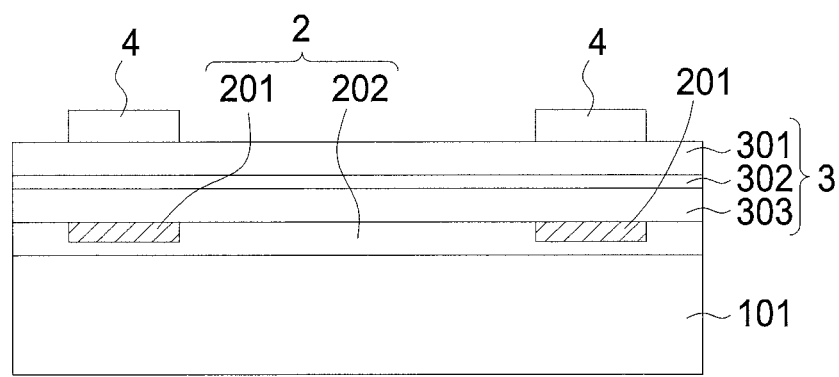
Figure 3E:
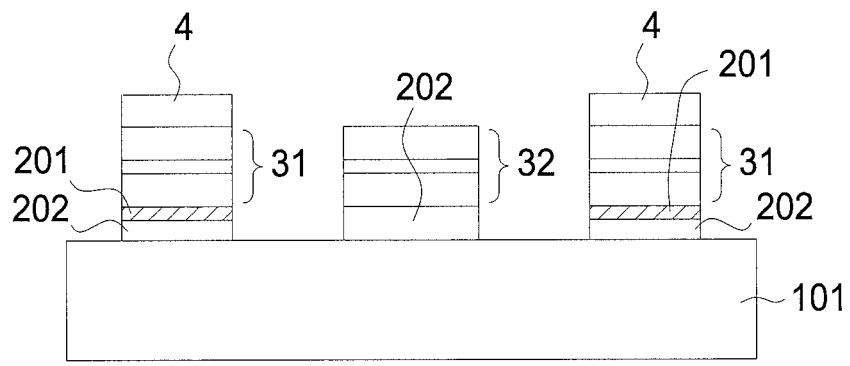
Figure 3F:
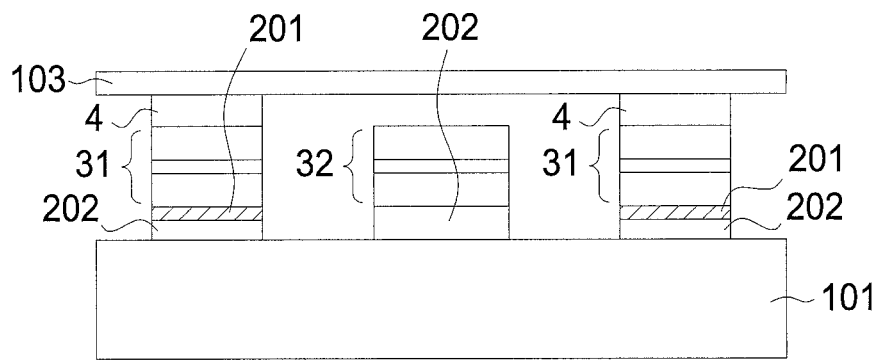
Figure 3G:
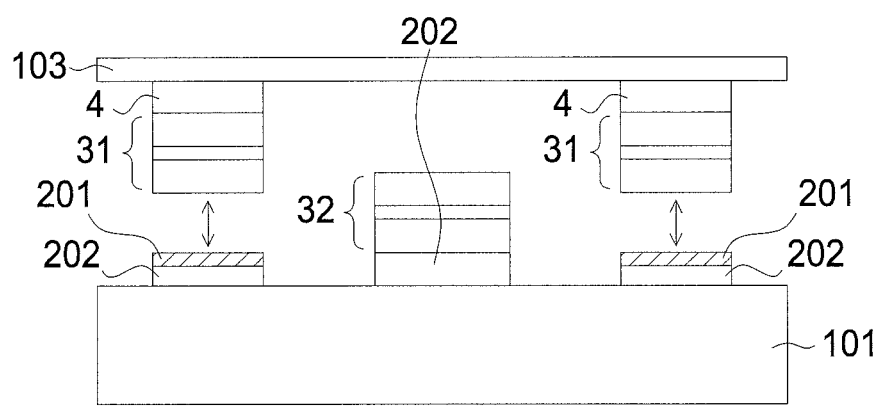
Figure 3H:
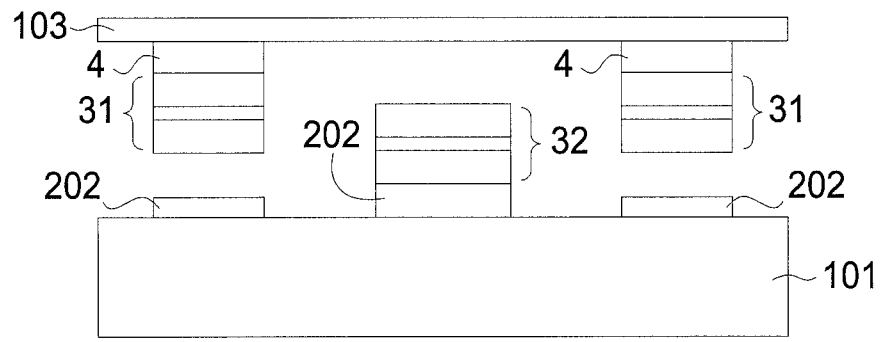

FIGS. 3A to 3H show the structures corresponding to the steps of a manufacturing process according to the third embodiment. As shown in FIG. 3A, the sacrificial layer 201 and the adhesion layer 202 are formed on the surface 311 of the semiconductor epitaxial stack 3 and the surface 1011 of the adhesion substrate 101 respectively in advance. Then, as shown in FIG. 3B, the semiconductor epitaxial stack 3 and the adhesion substrate 101 are bonded through the sacrificial layer 201 and the adhesion layer 202 by heating and pressing to form the adhesion structure 2. Because the material of the adhesion layer 202 comprises BCB, the sacrificial layer 201 extrudes the material of the adhesion layer 202 between the sacrificial layer 201 and the adhesion substrate 101 during the bonding process. Therefore, the thickness of the adhesion layer 202 between the sacrificial layer 201 and the adhesion substrate 101 is smaller than the thickness of the adhesion layer 202 between the semiconductor epitaxial stack 3 and the adhesion substrate 101. The difference between this embodiment and the first embodiment lies in the structure of the adhesion structure 2. In this embodiment, the sacrificial layer 201 is on the adhesion layer 202 and does not contact the surface 1011 of the adhesion substrate 101. The other processes shown in FIGS. 3B to 3H are the same as the first embodiment.

Fourth Embodiment

Figure 4A:
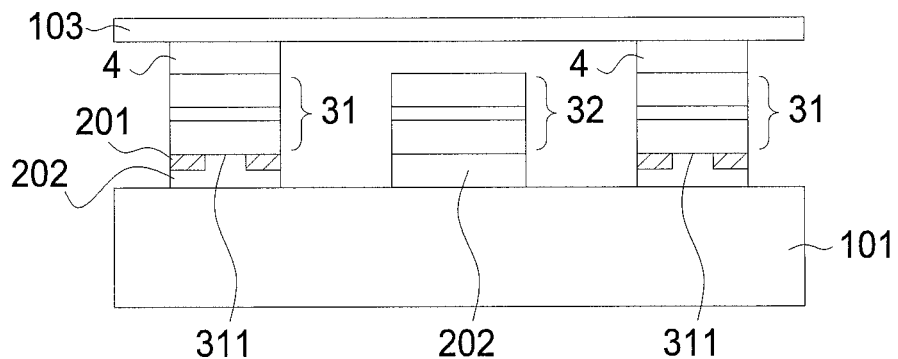
FIGS. 4A to 4C show the structures according to the fourth embodiment.
Figure 4B:
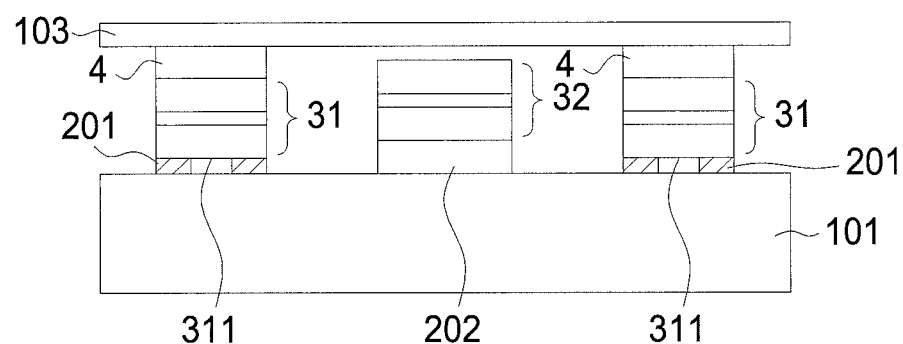
Figure 4C:
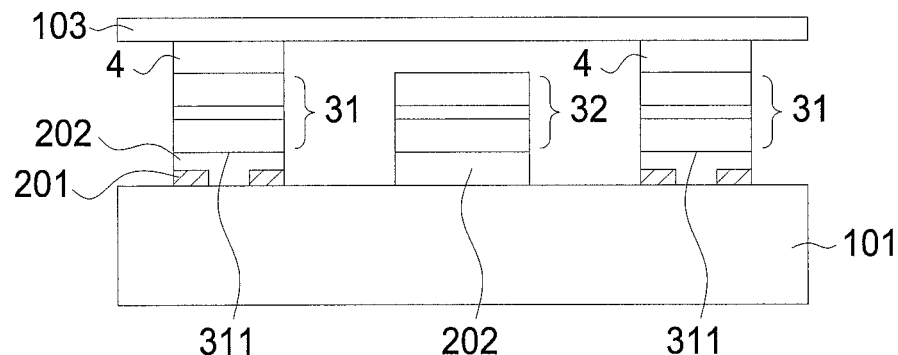

FIGS. 4A to 4C show the structures according to the fourth embodiment. As shown in FIG. 4A, the difference between this embodiment and the third embodiment is that the surface 311 of each of the first semiconductor epitaxial stacks 31 contacts the patterned sacrificial layer 201 and the adhesion layer 202. Alternatively, as shown in FIG. 4B, the difference between this embodiment and the first embodiment can be that the surface 311 of each of the first semiconductor epitaxial stacks 31 contacts the patterned sacrificial layer 201 and the adhesion layer 202. Alternatively, as shown in FIG. 4C, the difference between this embodiment and the second embodiment can be that each of the patterned sacrificial layers 201 corresponding to the first semiconductor epitaxial stacks 31 is covered by the adhesion layer 202 and adhered to the adhesion substrate 101. A growth substrate 102 is provided and a semiconductor epitaxial stack 3 is formed on the growth substrate 102 by epitaxial growth. Then, the growth substrate 102 and the semiconductor epitaxial stack 3 are adhered to the surface 1011 for being bonded with the adhesion substrate 101 through the adhesion structure 2

Fifth Embodiment

Figure 5A:
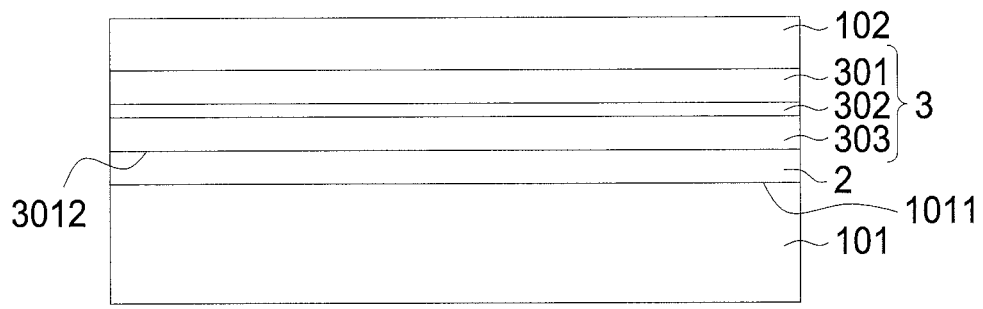
FIGS. 5A to 5G show the structures corresponding to the steps of a manufacturing process according to the fifth embodiment.

FIGS. 5A to 5G show the structures corresponding to the steps of a manufacturing process according to the fifth embodiment. As shown in FIG. 5A, according to the process for manufacturing the optoelectronic device of the application, an adhesion substrate 101 with a surface 1011 is provided, and an adhesion structure 2 is formed on the surface 1011, wherein the adhesion structure 2 has a thickness t. In this embodiment, the thickness t is between 1 μm and 10 μm, or preferably between 2 μm and 6 μm. The adhesion substrate 101 comprises an electrically insulated substrate or an electrically-conductive substrate. The material of electrically-insulated substrate comprises sapphire, diamond, glass, quartz, acryl, AlN, LiAlO$_2$ or ceramics; the material of electrically-conductive substrate comprises semiconductor such as Si, GaAs, SiC, GaN and AlN; oxide such as ZnO; metal material; or the combination thereof. The adhesion structure 2 comprises organic material or inorganic material, wherein the organic material comprises acrylic acid, Unsaturated polyester, epoxy, oxetane, vinyl ether, nylon, PP, PBT, PPO, PC, ABS, PVC or BCB; the inorganic material comprises metal such as Ti, Au, Be, W, Al, Ge, Cu and combination thereof, oxide such as ITO, CTO, ATO, IZO, AZO, ZTO, ZnO and SiO$_x$, or nitride such as SiN$_x$. The semiconductor epitaxial stack 3 comprises a first semiconductor layer 301 having a first type conductivity, a converting unit 302, and a second semiconductor layer 303 having a second type conductivity sequentially formed on the growth substrate 102. The first semiconductor layer 301 and the second semiconductor layer 303 both are single-layer structure or multi-layer structure (multi-layer means two or more than two layers). The first semiconductor layer 301 and the second semiconductor layer 303 have different conductive types, different electrical types, different polarities, or are doped with different elements for providing electrons or holes. When the first semiconductor layer 301 is p-type semiconductor, the second semiconductor layer 303 is n-type semiconductor, of which the electrical type is different from that of the p-type semiconductor. On the contrary, when the first semiconductor layer 301 is n-type semiconductor, the second semiconductor layer 303 is p-type semiconductor. The converting unit 302 is formed between the first semiconductor layer 301 and the second semiconductor layer 303. The converting unit 302 is able to mutually convert light into electrical power or electrical power into light. The semiconductor epitaxial stack 3 can further be adopted in a semiconductor device, equipment, product or circuit for mutually converting light into electrical power or electrical power into light. Specifically, the semiconductor epitaxial stack 3 can further form a light-emitting diode (LED), a laser diode (LD), a solar cell or be adopted in a display. Taking the light-emitting diode (LED) as an example, the wavelength of the light emitted can be adjusted by adjusting the combination of one layer or multiple layers of the semiconductor epitaxial stack 3. The material of the semiconductor epitaxial stack 3 comprises aluminum gallium indium phosphide (AlGaInP) series, aluminum gallium indium nitride (AlGaInN) series or zinc oxide (ZnO) series. The structure of the converting unit 302 comprises single heterostructure (SH), double heterostructure (DH), double-side double heterostructure (DDH) or multi-quantum well (MWQ). Specifically, the converting unit 302 can be intrinsic, p-type, or n-type semiconductor. When an electrical current passes through the semiconductor epitaxial stack 3, the converting unit 302 is able to emit light. As the converting unit 302 is made of aluminum gallium indium phosphide (AlGaInP) series, the light emitted from the converting unit 302 is amber series such as red, orange, and yellow. As the converting unit 302 is made of aluminum gallium indium nitride (AlGaInN) series, the light emitted from the converting unit 302 is blue or green.

In another embodiment, the adhesion structure 2 is formed on a surface 3012 of the semiconductor epitaxial stack 3 in advance, and the growth substrate 102 and the semiconductor epitaxial stack 3 are adhered to the surface 1011 for being bonded with the adhesion substrate 101 through the adhesion structure 2.

Figure 5B:
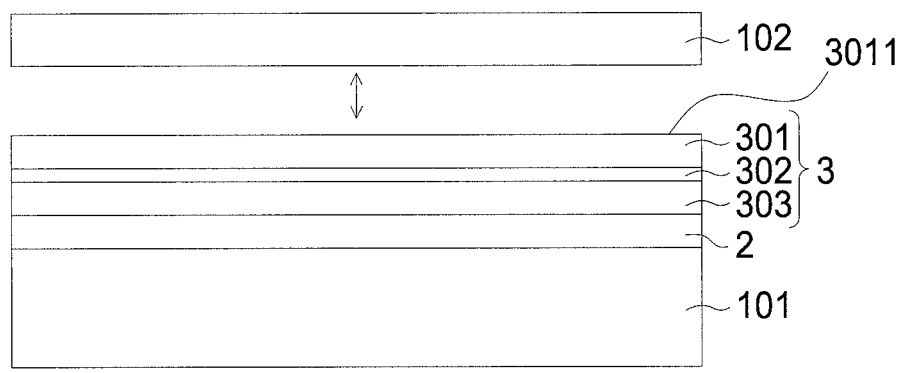

In the next step, as shown in FIG. 5B, the growth substrate 102 is separated from the semiconductor epitaxial stack 3 and a surface 3011 of the semiconductor epitaxial stack 3 is exposed. The method of separating the growth substrate 102 comprises irradiation method which uses a laser penetrating the growth substrate 102 to irradiate the interface between the growth substrate 102 and the semiconductor epitaxial stack 3 for separating the semiconductor epitaxial stack 3 and the growth substrate 102. In addition, wet etching method can be applied to directly remove the growth substrate 102 or remove an interlayer (not shown) between the growth substrate 102 and the semiconductor epitaxial stack 3 for separating the semiconductor epitaxial stack 3 and the growth substrate 102. Besides, the interlayer between the growth substrate 102 and the semiconductor epitaxial stack 3 can be removed by using vapor etch method in high temperature for separating the semiconductor epitaxial stack 3 and the growth substrate 102.

Figure 5C:
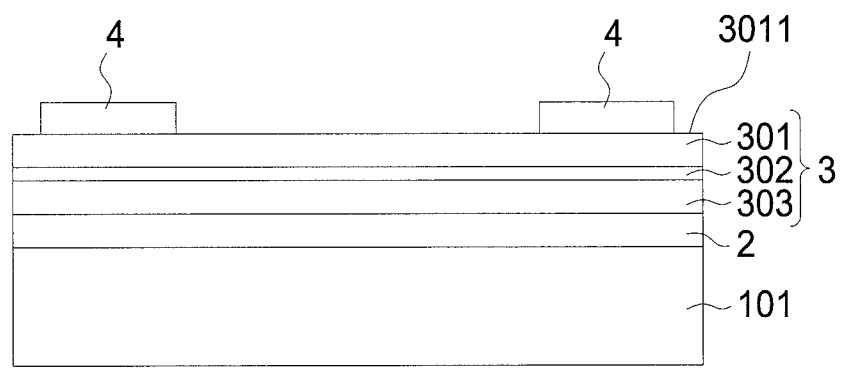

In the next step, as shown in FIG. 5C, a patterned adhesion medium 4 corresponding to the sacrificial layer 201 is formed on the surface 3011 of the semiconductor epitaxial stack 3, wherein the method of forming the patterned adhesion medium 4 comprises forming a layer of adhesion medium layer on the surface 3011 and, then, using photolithography method or etching method to pattern the layer of adhesion medium layer to form the patterned adhesion medium 4, wherein the photolithography method and the patterned etching method are generally semiconductor producing processes. The material of the patterned adhesion medium 4 comprises organic material or inorganic material, wherein the organic material comprises acrylic acid, unsaturated polyester, epoxy, oxetane, vinyl ether, nylon, PP, PBT, PPO, PC, ABS, PVC or BCB, and the inorganic material comprises metal such as Ti, Au, Be, W, Al, Ge, Cu and combination thereof, oxide such as ITO, CTO, ATO, IZO, AZO, ZTO, ZnO and $SiO_x$, or nitride such as $SiN_x$.

Figure 5D:
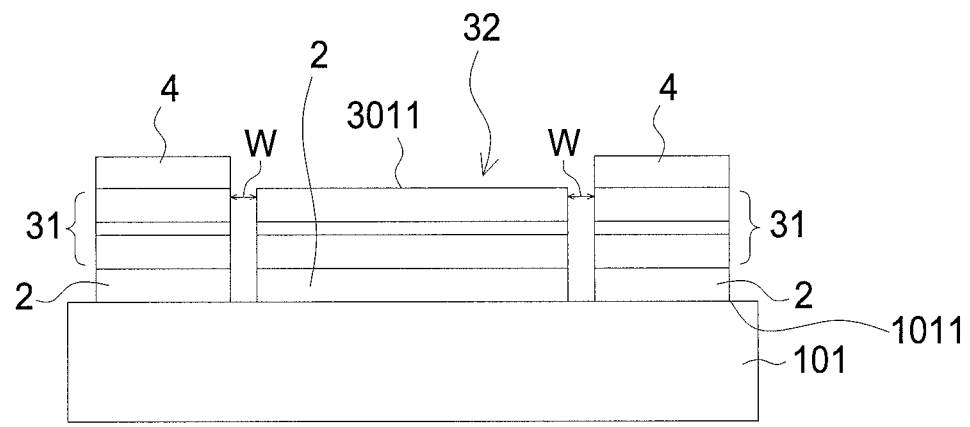
Figure 5E:
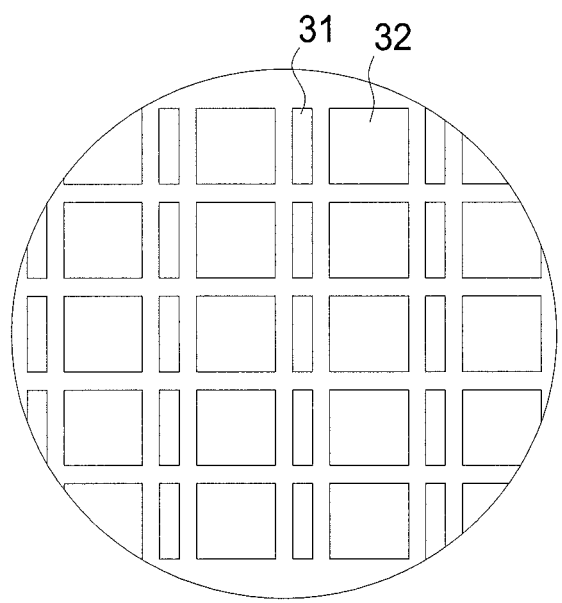

In the next step, as shown in FIG. 5D, the semiconductor epitaxial stack 3 and the adhesion structure 2 are patterned to reveal the surface 1011 so a plurality of semiconductor epitaxial stacks is formed, wherein the multiple semiconductor epitaxial stacks are separated. The multiple semiconductor epitaxial stacks comprise a first semiconductor epitaxial stack 31 and a second semiconductor epitaxial stack 32. FIG. 5E shows the top-view of the first semiconductor epitaxial stacks 31 and the second semiconductor epitaxial stacks 32 in FIG. 5D. In this embodiment, the area of the first semiconductor epitaxial stack 31 is smaller than the area of the second semiconductor epitaxial stacks 32. And, each of the first semiconductor epitaxial stacks 31 has the adhesion medium 4 thereon, and the second semiconductor epitaxial stack 32 has no the adhesion medium 4 on the surface 3011. The method of patterning the semiconductor epitaxial stack 3 and the adhesion structure 2 comprises wet etching or dry etching. In this embodiment, dry etching method is applied to make an interval w between the first semiconductor epitaxial stack 31 and the second semiconductor epitaxial stack 32 as small as possible to prevent epitaxial stack of the semiconductor epitaxial stack 3 from being removed excessively. In this embodiment, the interval w is between 1 μm and 10 μm, or preferably about 5 μm.

Figure 5F:
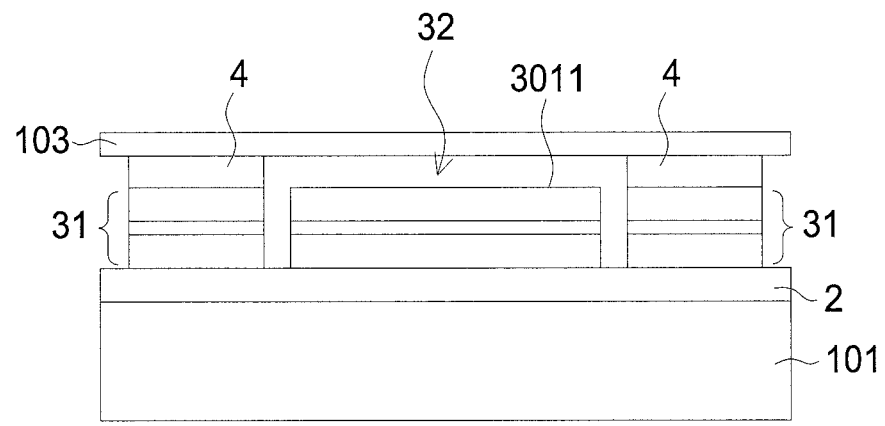

In the next step, as shown in FIG. 5F, a picking unit 103 is provided to stick the adhesion medium 4 by heating, pressing, or using the stickiness of the picking unit 103. The picking unit 103 comprises electrically-conductive material, such as electrically-conductive substrate and printed circuit board, wherein the electrically-conductive substrate comprises semiconductor such as Si, GaAs, SiC, GaN, and AlN; oxide such as ZnO; metal or the combination thereof, and the printed circuit board comprises single-sided printed circuit board, double-sided printed circuit board, multi-layers printed circuit board, or flexible printed circuit board; or electrically-insulated material such as sapphire, diamond, glass, quartz, acryl, $LiAlO_2$, ceramics substrate and EPS tape. When the EPS tape is used as the picking unit 103, it is necessary to provide a hard substrate to stick the EPS tape for supporting the EPS tape and for preventing the EPS tape from sticking the surface 3011 of the second semiconductor epitaxial stack 32. In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN), or polyimide (PI), and the supporting structure 1031 comprises hard substrate such as sapphire, diamond, glass, quartz and acryl, for supporting the flexible substrate 1032.

In another embodiment, the patterned adhesion medium 4 is able to be formed on the picking unit 103 in advance. Then, the alignment bonding technology is applied to align the adhesion medium 4 and the first semiconductor epitaxial stack 31 firstly and to bond the adhesion medium 4 and the first semiconductor epitaxial stack 31 by heating and pressing for forming the structure shown in FIG. 5F.

Figure 5G:
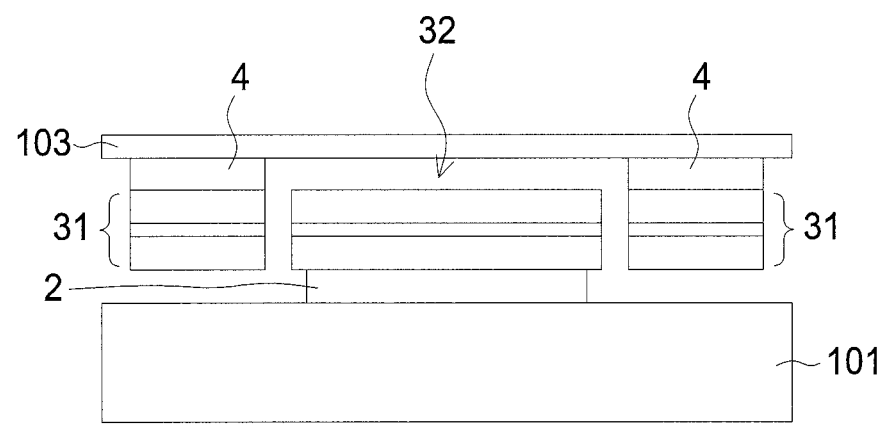

In the next step, as shown in FIG. 5G, the adhesion structure 2 is etched by using wet etching or vapor etching. The etching time of the wet etching or the vapor etching is limited to make the first semiconductor epitaxial stack 31 being totally separated from the adhesion substrate 101 and a portion of the adhesion structure 2 remaining between the second semiconductor epitaxial stack 32 and adhesion substrate 101 to support the second semiconductor epitaxial stack 32.

In another embodiment, as mentioned above, the picking unit 103 comprises the flexible substrate 1032 and the supporting structure 1031. After the first semiconductor epitaxial stack 31 is separated from the sacrificial layer 201, the flexible substrate 1032 and the supporting structure 1031 are able to be separated to form a flexible display, as shown in FIG. 11B.

Sixth Embodiment

Figure 6A:
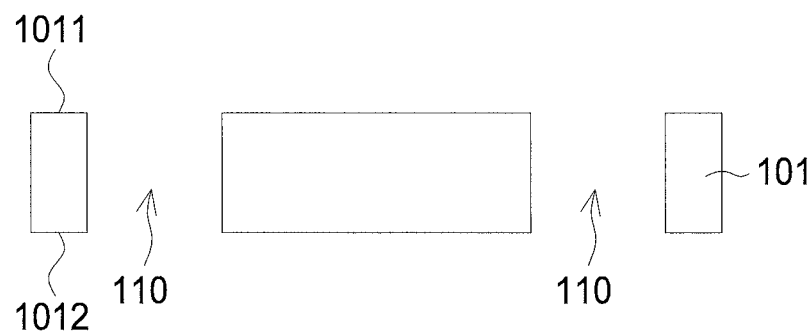
FIGS. 6A to 6H show the structures corresponding to the steps of a manufacturing process according to the sixth embodiment.
Figure 6B:
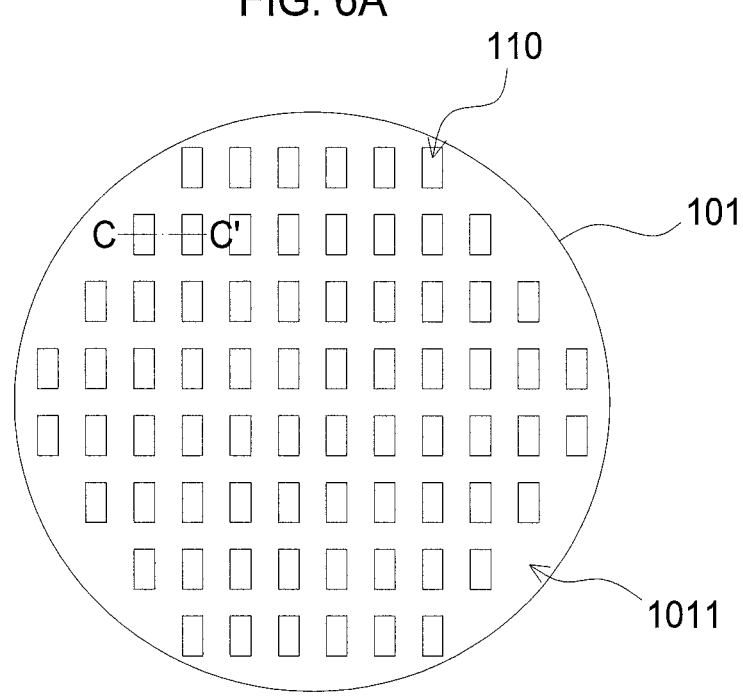

FIGS. 6A to 6H show the structures corresponding to the steps of a manufacturing process according to the sixth embodiment. As shown in FIG. 6A, according to the process for manufacturing the optoelectronic device of the application, an adhesion substrate 101 is provided and the adhesion substrate 101 has a surface 1011 and a surface 1012 opposite to the surface 1011. The adhesion substrate 101 has a hole 110 passing from the surface 1011 to the surface 1012. FIG. 6B shows the top-view of the adhesion substrate 101, wherein FIG. 6A shows the cross-sectional diagram along the dotted line CC' of FIG. 6B. The adhesion substrate 101 comprises an electrically-insulated substrate or an electrically-conductive substrate. The material of electrically-insulated substrate comprises sapphire, diamond, glass, quartz, acryl, $LiAlO_2$, or ceramics; the material of electrically-conductive substrate comprises semiconductor such as Si, GaAs, SiC, GaN, AlN; oxide such as ZnO; metal material or the combination thereof.

Figure 6C:
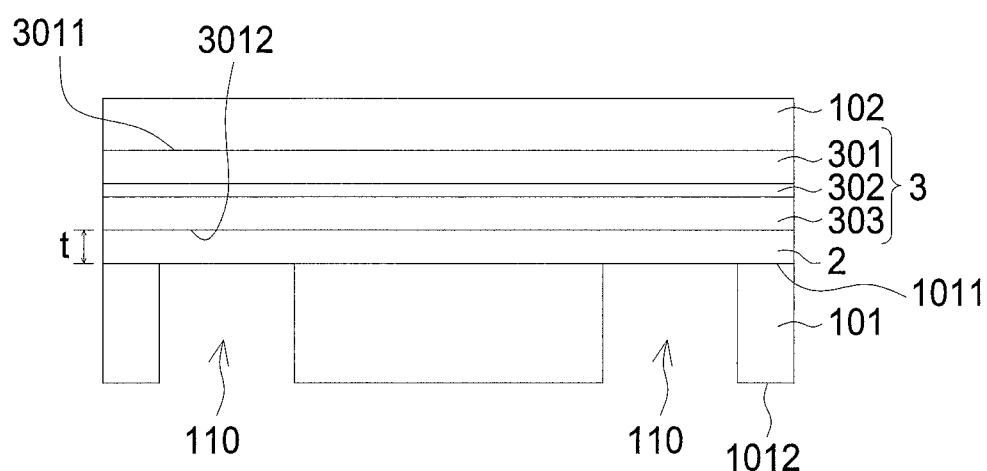

In the next step, as shown in FIG. 6C, a growth substrate 102 is provided and a semiconductor epitaxial stack 3 is formed on the growth substrate 102 by epitaxial growth. Then, the growth substrate 102 and the semiconductor epitaxial stack 3 are adhered to the surface 1011 for being bonded with the adhesion substrate 101 through the adhesion structure 2, wherein the holes 110 reveal a portion of the adhesion structure 2. In this embodiment, the adhesion structure 2 can be formed on the surface 3012 of the semiconductor epitaxial stack 3 in advance, and then, the growth substrate 102 and the semiconductor epitaxial stack 3 are adhered to the surface 1011 for being bonded with the adhesion substrate 101 through the adhesion structure 2.

The adhesion structure 2 has a thickness t between 1 µm and 10 µm, or preferably between 2 µm and 6 µm. The adhesion structure 2 comprises organic material or inorganic material, wherein the organic material comprises acrylic acid, unsaturated polyester, epoxy, oxetane, vinyl ether, nylon, PP, PBT, PPO, PC, ABS, PVC, or BCB, and the inorganic material comprises metal such as Ti, Au, Be, W, Al, Ge, Cu and combination thereof; oxide such as ITO, CTO, ATO, IZO, AZO, ZTO, ZnO and $SiO_x$; or nitride such as $SiN_x$. The semiconductor epitaxial stack 3 comprises a first semiconductor layer 301 having a first type conductivity, a converting unit 302, and a second semiconductor layer 303 having a second type conductivity sequentially formed on the growth substrate 102. The first semiconductor layer 301 and the second semiconductor layer 303 both are single-layer structure or multi-layer structure (multi-layer means two or more than two layers). The first semiconductor layer 301 and the second semiconductor layer 303 have different conductive types, different electrical types, and different polarities, or are doped with different elements for providing electrons or holes. When the first semiconductor layer 301 is p-type semiconductor, the second semiconductor layer 303 is n-type semiconductor, of which the electrical type is different from that of the p-type semiconductor. On the contrary, when the first semiconductor layer 301 is n-type semiconductor, the second semiconductor layer 303 is p-type semiconductor. The converting unit 302 is formed between the first semiconductor layer 301 and the second semiconductor layer 303. The converting unit 302 is able to convert light into electrical power or electrical power into light mutually. The semiconductor epitaxial stack 3 can be further adopted in a semiconductor device, equipment, product or circuit for mutually converting light into electrical power or electrical power into light. Specifically, the semiconductor epitaxial stack 3 can further form a light-emitting diode (LED), a laser diode (LD), a solar cell or be adopted in a display. Taking the light-emitting diode (LED) as an example, the wavelength of the light emitted can be adjusted by adjusting the combination of one layer or multiple layers of the semiconductor epitaxial stack 3. The material of the semiconductor epitaxial stack 3 comprises aluminum gallium indium phosphide (AlGaInP) series, aluminum gallium indium nitride (AlGaInN) series, or zinc oxide (ZnO) series. The structure of the converting unit 302 comprises single heterostructure (SH), double heterostructure (DH), double-side double heterostructure (DDH) or multi-quantum well (MWQ). Specifically, the converting unit 302 can be intrinsic, p-type, or n-type semiconductor. When an electrical current passes through the semiconductor epitaxial stack 3, the converting unit 302 is able to emit a light. As the converting unit 302 is made of aluminum gallium indium phosphide (AlGaInP) series, the light emitted from the converting unit 302 is amber series, such as red, orange and yellow. As the converting unit 302 is made of aluminum gallium indium nitride (AlGaInN) series, the light emitted from the converting unit 302 is blue or green.

Figure 6D:
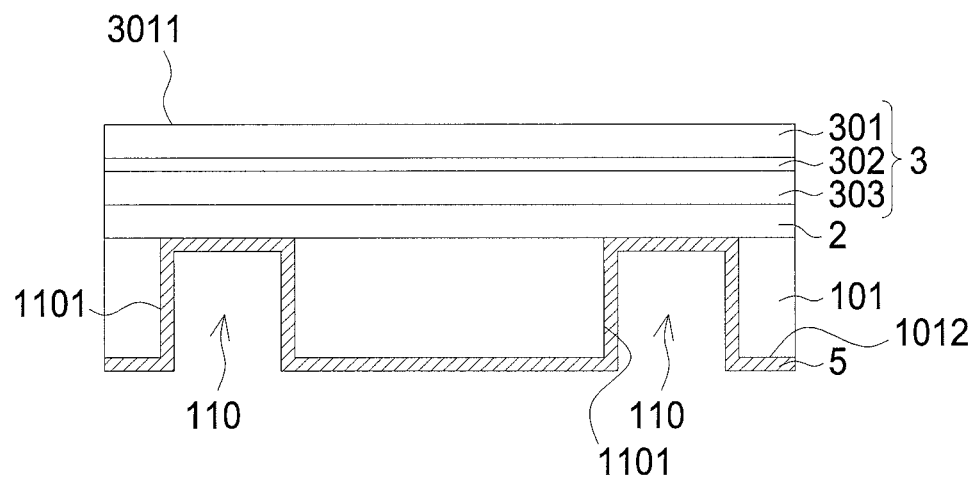

In the next step, as shown in FIG. 6D, the growth substrate 102 is separated from the semiconductor epitaxial stack 3 for revealing a surface 3011 of the semiconductor epitaxial stack 3, and a support structure 5 is formed on and conformally covers the surface 1012 of the adhesion substrate 101, a wall surface 1101 of the holes 110 and a portion of the adhesion structure 2 exposed from the holes 110. In the embodiment, the method of separating the growth substrate 102 comprises the methods mentioned in the first embodiment. The material of the support structure 5 comprises organic material or inorganic material, wherein the organic material comprises UV dissociated glue or thermoplastic, and the inorganic material, comprises metal, oxide or nitride, wherein UV dissociated glue comprises acrylic acid, unsaturated polyester, epoxy, oxetane or vinyl ether, the thermoplastic comprises Nylon, PP, PBT, PPO, PC, ABS or PVC, the metal comprises Ti, Au, Be, W, Al or Ge, the oxide comprises $SiO_x$, and the nitride comprises $SiN_x$.

Figure 6E:
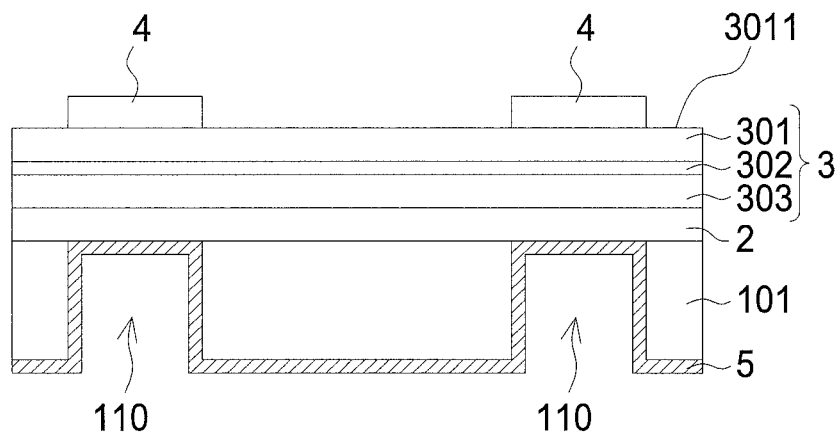

In the next step, as shown in the FIG. 6E, a patterned adhesion medium 4 corresponding to the holes 110 is formed on the surface 3011 of the semiconductor epitaxial stack 3, wherein the method of forming the patterned adhesion medium 4 comprises forming a layer of adhesion medium layer on the surface 3011 and then, using photolithography method or etching method to pattern the layer of adhesion medium layer to form the patterned adhesion medium 4, wherein the photolithography method and the patterned etching method are generally semiconductor producing processes. The material of the patterned adhesion medium 4 comprises organic material or inorganic material, wherein the organic material comprises acrylic acid, unsaturated polyester, epoxy, oxetane, vinyl ether, nylon, PP, PBT, PPO, PC, ABS, PVC or BCB, and the inorganic material comprises metal such as Ti, Au, Be, W, Al, Ge, Cu and combination thereof, oxide such as ITO, CTO, ATO, IZO, AZO, ZTO, ZnO and $SiO_x$, or nitride such as $SiN_x$.

Figure 6F:
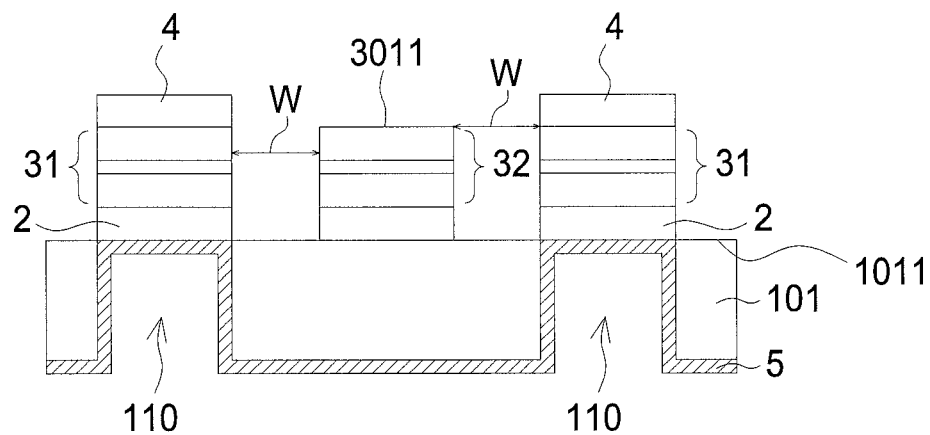

In the next step, as shown in FIG. 6F, the semiconductor epitaxial stack 3 and the adhesion structure 2 are patterned to reveal the surface 1011, so a plurality of semiconductor epitaxial stacks is formed, wherein the multiple semiconductor epitaxial stacks are separated. The multiple semiconductor epitaxial stacks comprise a first semiconductor epitaxial stack 31 and a second semiconductor epitaxial stack 32, wherein the first semiconductor epitaxial stack 31 has the adhesion medium 4 thereon and the second semiconductor epitaxial stack 32 has no the adhesion medium 4 on the surface 3011. The method of patterning the semiconductor epitaxial stack 3 and the adhesion structure 2 comprises wet etching or dry etching. In this embodiment, dry etching method is applied to make an interval w between the first semiconductor epitaxial stack 31 and the second semiconductor epitaxial stack 32 as small as possible to prevent epitaxial stack of the semiconductor epitaxial stack 3 from being removed excessively. In this embodiment, the interval w is between 1 µm and 10 µm, or preferably about 5 µm.

Figure 6G:
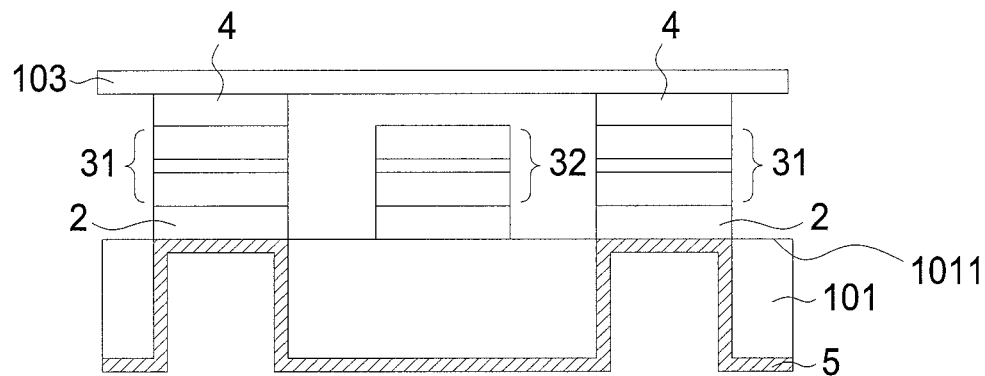

In the next step, as shown in FIG. 6G, a picking unit 103 is provided to stick the adhesion medium 4 by heating, pressing, or using stickiness of the picking unit 103. The picking unit 103 comprises electrically-conductive material, such as electrically-conductive substrate and printed circuit board, wherein the electrically-conductive substrate comprises semiconductor such as Si, GaAs, SiC, GaN, AlN; oxide such as ZnO; metal or the combination thereof, and the printed circuit board comprises single-sided printed circuit board, double-sided printed circuit board, multi-layers printed circuit board or flexible printed circuit board; or electrically-insulated material, such as sapphire, diamond, glass, quartz, acryl, LiAlO$_2$, ceramics and EPS tape. When the EPS tape is used as the picking unit 103, it is necessary to provide a hard substrate to stick the EPS tape for supporting the EPS tape and for preventing the EPS tape from sticking the surface 3011 of the second semiconductor epitaxial stack 32.

In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN) or polyimide (PI), and the supporting structure 1031 comprises hard substrate such as sapphire, diamond, glass, quartz and acryl, for supporting the flexible substrate 1032.

In another embodiment, the patterned adhesion medium 4 is able to be formed on the picking unit 103 in advance. Then, the alignment bonding technology is applied to align the adhesion medium 4 and the first semiconductor epitaxial stack 31 firstly and, then, bond the adhesion medium 4 and the first semiconductor epitaxial stack 31 by heating and pressing.

Figure 6H:
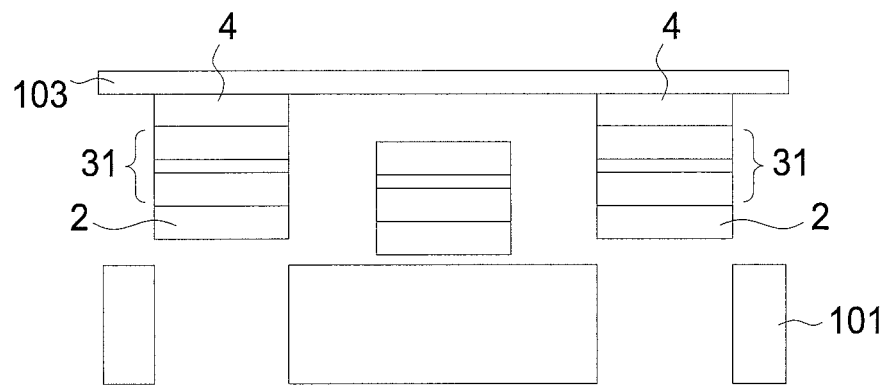
Figure 7A:
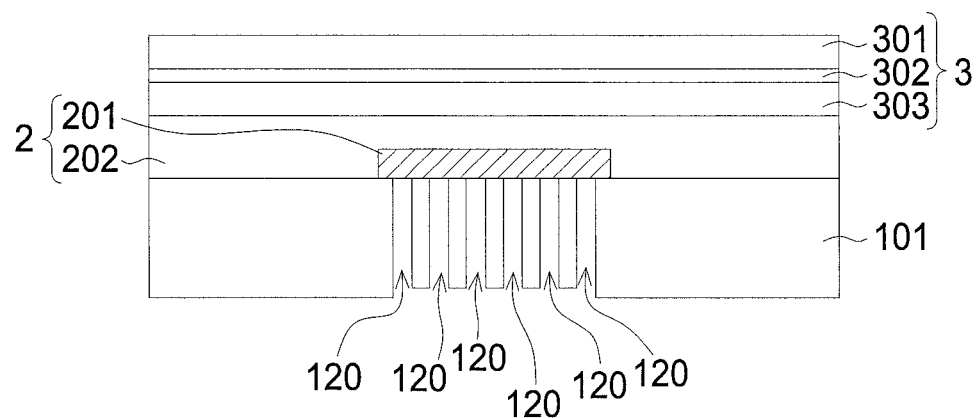
FIGS. 7A to 7F show the structures corresponding to the steps of a manufacturing process according to the seventh embodiment.
Figure 7B:
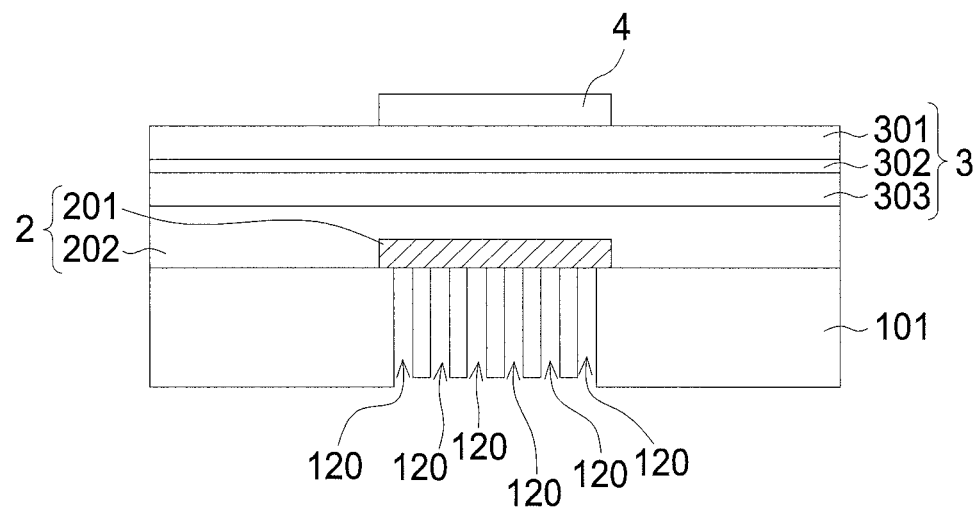
Figure 7C:
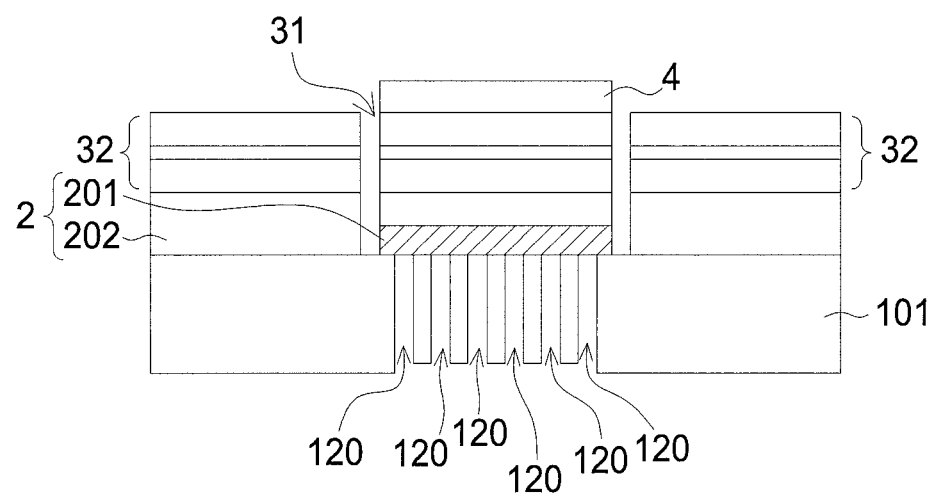
Figure 7D:
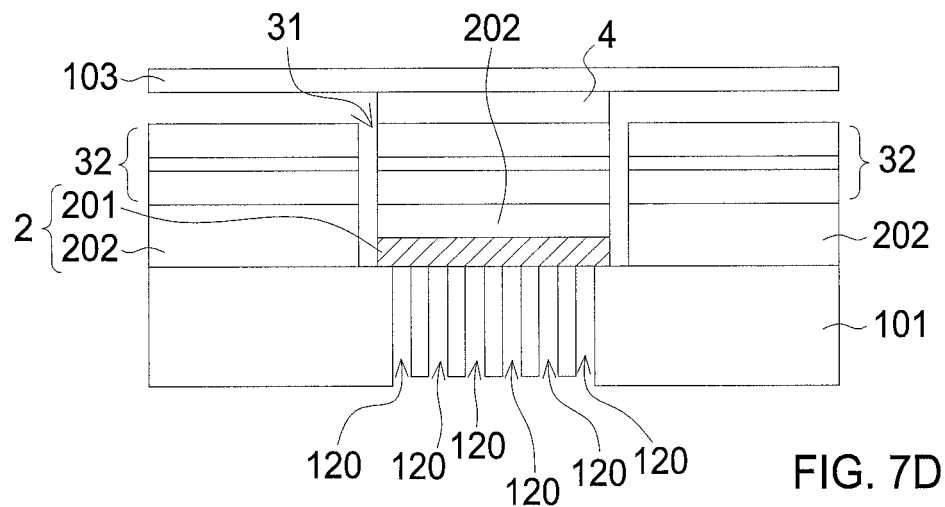
Figure 7E:
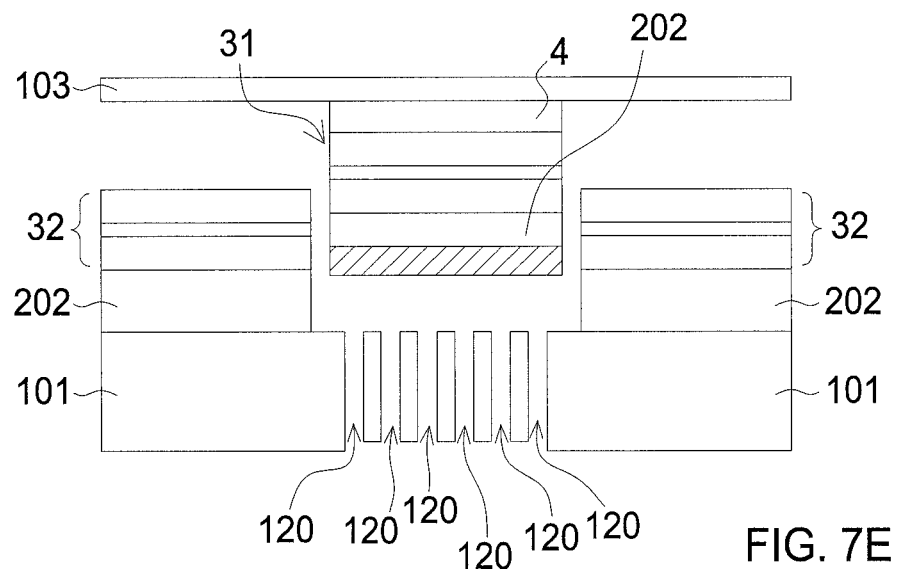
Figure 7F:
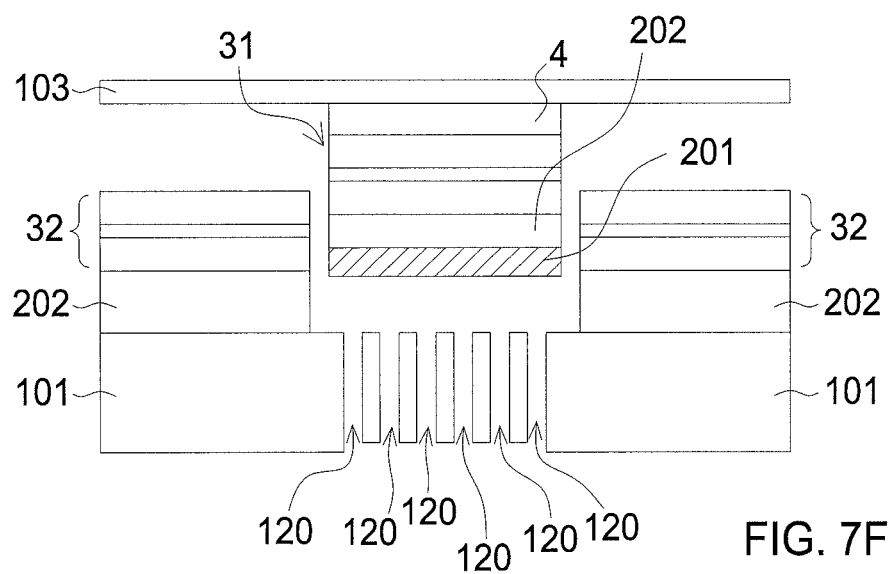
Figure 8A:
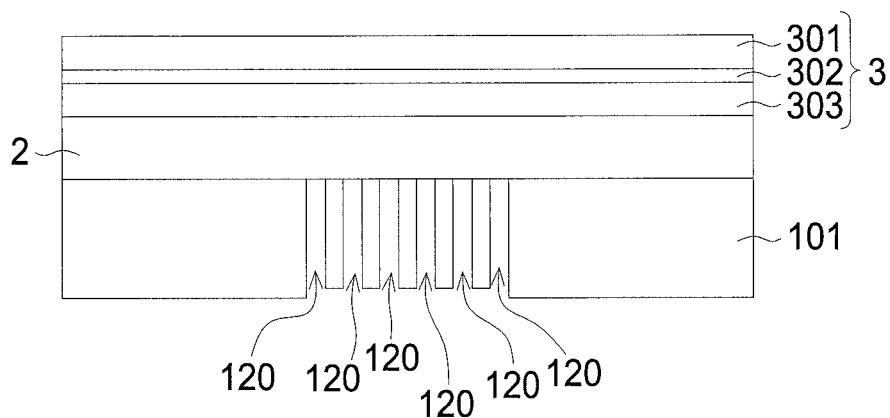
FIGS. 8A to 8F show the structures corresponding to the steps of a manufacturing process according to the eighth embodiment.
Figure 8B:
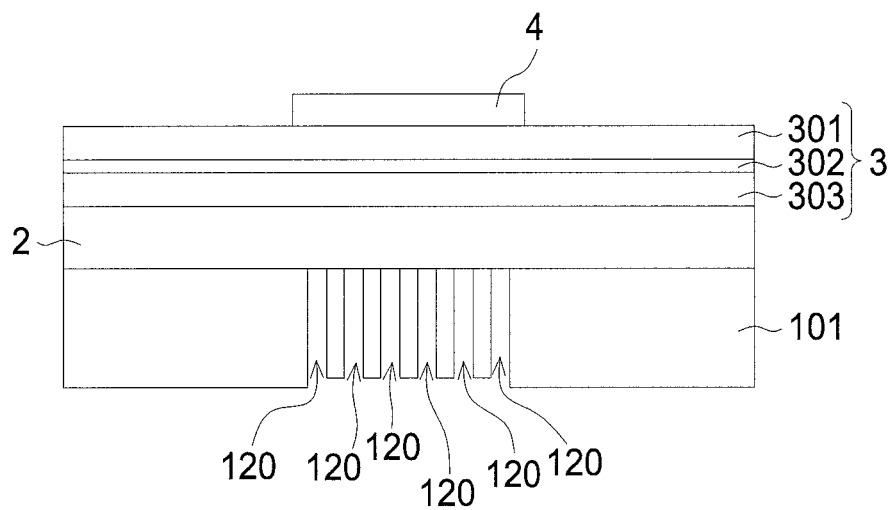
Figure 8C:
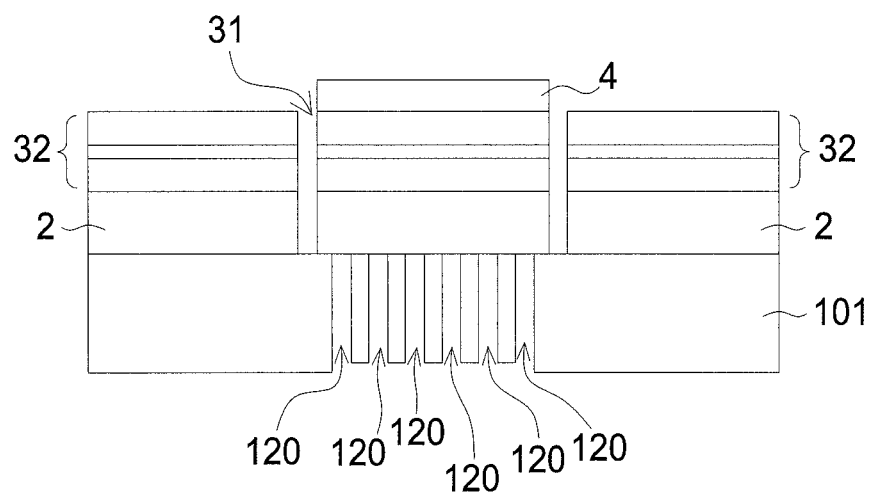
Figure 8D:
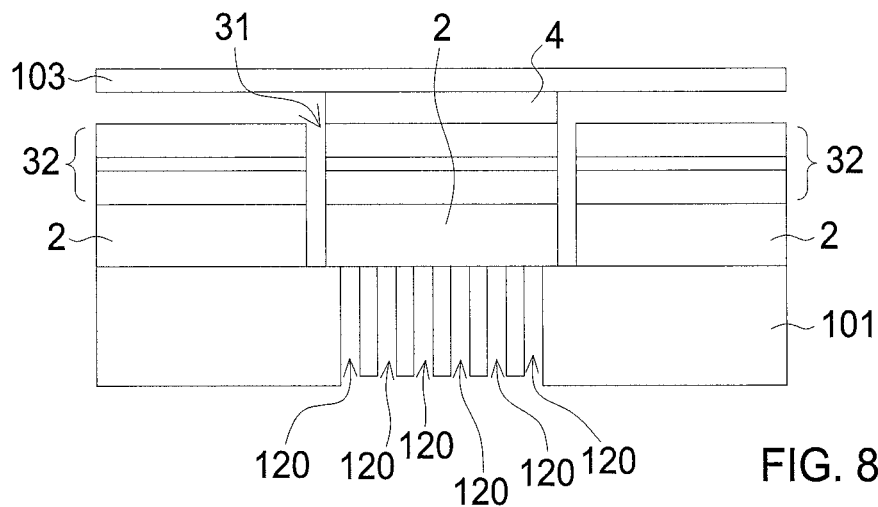
Figure 8E:
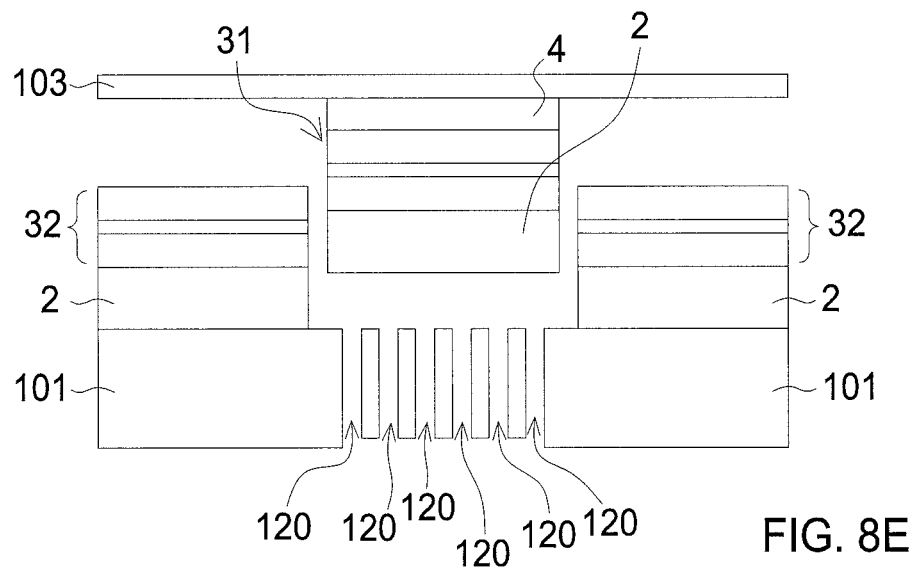
Figure 8F:
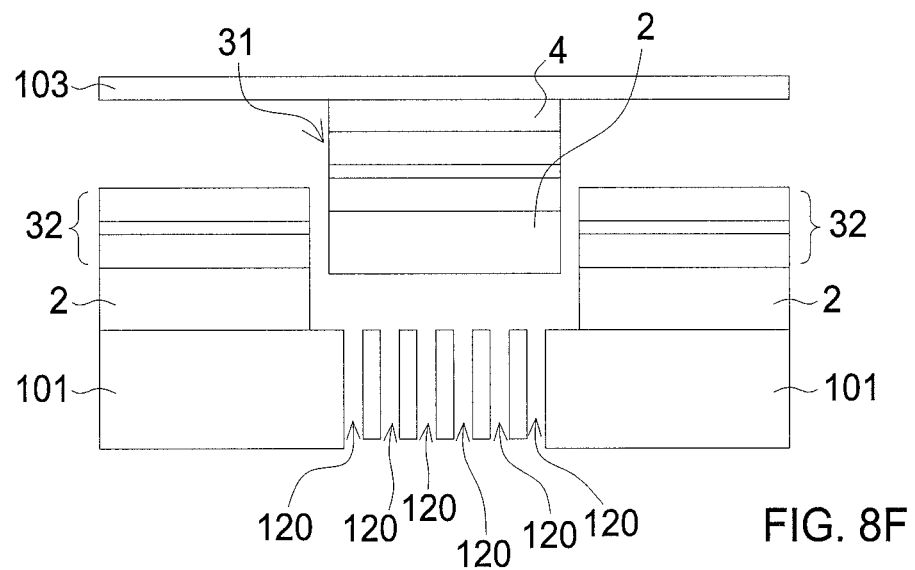

In the next step, as shown in FIG. 6H, when the material of the support structure 5 is metal such as Ti, Al, TiW and Ag, or the material containing Si, such as SiO$_x$, SiN$_x$ and poly-Si, the support structure 5 can be removed by wet etching or vapor etching, and, then, the forces in the opposite directions are directly applied on the picking unit 103 and the adhesion substrate 101 respectively to separate the first semiconductor epitaxial stack 31 and the sacrificial layer 201. In this embodiment, the etchant used in the wet etching process comprises hydrofluoric (HF) acid, and the chemical material used in the vapor etching process comprises hydrofluoric (HF) vapor. When the material of the support structure 5 is UV dissociated material comprising acrylic acid, unsaturated polyester, epoxy, oxetane or vinyl ether, the adhesion between the support structure 5 and the adhesion structure 2 can be reduced or disappears by using UV light to irradiate the support structure 5, and, then, the forces in the opposite directions are directly applied on the picking unit 103 and the adhesion substrate 101 respectively to separate the first semiconductor epitaxial stack 31 and the support structure 5. When the material of the support structure 5 is thermoplastic comprising nylon, PP, PBT, PPO, PC, ABS or PVC, the adhesion between the support structure 5 and the adhesion structure 2 can be reduced or disappears by heating the support structure 5, and, then, the forces in the opposite directions are directly applied on the picking unit 103 and the adhesion substrate 101 respectively to separate the first semiconductor epitaxial stack 31 and the support structure 5.

In another embodiment, as mentioned above, the picking unit 103 comprises the flexible substrate 1032 and the supporting structure 1031. After the first semiconductor epitaxial stack 31 is separated from the sacrificial layer 201, the flexible substrate 1032 and the supporting structure 1031 are able to be separated to form a flexible display, as shown in FIG. 11B.

Seventh Embodiment

FIGS. 7A to 7F show the structures corresponding to the steps of a manufacturing process according to the seventh embodiment. The difference between this embodiment and the second embodiment is that the adhesion substrate 101 comprises multiple holes 120 corresponding to each first semiconductor epitaxial stack 31 so that the adhesion between the first semiconductor epitaxial stack 31 and the adhesion substrate 101 in this embodiment is lower than the adhesion between the first semiconductor epitaxial stack 31 and the adhesion substrate 101 in the second embodiment. Therefore, it is easier to separate the first semiconductor epitaxial stack 31 from the adhesion substrate 101 by using mechanical force. Or when the sacrificial layer 201 is removed by wet etching or vapor etching, it needs less time for the etchant comprising hydrofluoric (HF) acid or the chemical material comprising hydrofluoric (HF) vapor to etch the sacrificial layer 201 through the multiple holes 120.

Eighth Embodiment

FIGS. 8A to 8F show the structures corresponding to the steps of a manufacturing process according to the eighth embodiment. The difference between this embodiment and the seventh embodiment is there is no sacrificial layer in the adhesion structure 2 in this embodiment. The adhesion between the first semiconductor epitaxial stack 31 and the adhesion substrate 101 in this embodiment is lower than the adhesion between the first semiconductor epitaxial stack 31 and the adhesion substrate 101, and the first semiconductor epitaxial stack 31 can be separated from the adhesion substrate 101 by using mechanical force.

Ninth Embodiment

Figure 9A:
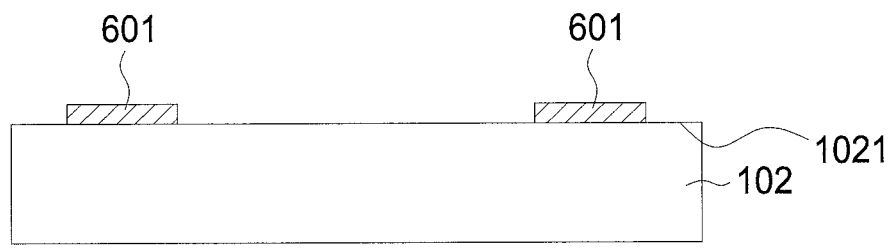
FIGS. 9A to 9I show the structures corresponding to the steps of a manufacturing process according to the ninth embodiment.

FIGS. 9A to 9I show the structures corresponding to the steps of a manufacturing process according to the ninth embodiment. As shown in FIG. 9A, a growth substrate 102 having a surface 1021 is provided, wherein the surface 1021 is used for growing a semiconductor epitaxial stack thereon in following processes. The material of the growth substrate 102 comprises Ge, GaAs, InP, GaP, sapphire, SiC, Si, LiAlO$_2$, ZnO, GaN, AlN or the combination thereof. A patterned sacrificial layer 601 is formed on the surface 1021 of the growth substrate 102, wherein the material of the sacrificial layer 601 comprises semiconductor such as AlAs and AlN, or oxide such as SiO$_x$. When the material of the sacrificial layer 601 is semiconductor, the patterned sacrificial layer 601 is formed by Metalorganic Chemical Vapor Deposition (MOCVD) and etching process to pattern the sacrificial layer 601. When the material of the sacrificial layer 601 is oxide, the patterned sacrificial layer 601 is formed by Physical Vapor Deposition (PVD) or Chemical Vapor Deposition (CVD) and etching process to pattern the sacrificial layer 601.

Figure 9B:
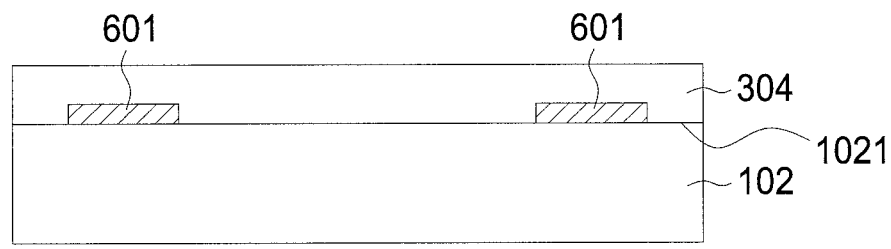

In the next step, as shown in FIG. 9B, a semiconductor layer 304 is formed on the surface 1021 of the growth substrate 102 and covers the sacrificial layer 601, wherein the material of the semiconductor layer 304 is different from the material of the sacrificial layer 601. The semiconductor layer 304 comprises a buffer layer (not shown) or a window layer (not shown). The buffer layer is between the growth substrate 102 and the window layer or between the growth substrate 102 and a semiconductor epitaxial stack 3 which is formed in the following processes. In the structure of light-emitting diode, the buffer layer is used for reducing the lattice mismatch between two layers made of different materials. On the other hand, the buffer layer comprises single layer, multiple layers, a combination of two kinds of materials or two separated structures, wherein the material of the buffer layer comprises organic metal, inorganic metal or semiconductor. The buffer layer is able to be used as a reflective layer, thermally conductive layer, electrically-conductive layer, ohmic-contact layer, anti-deformation layer, stress release layer, stress adjusting layer, bonding layer, wavelength converter layer or fixed structure. The window layer is a semiconductor layer with larger thickness for increasing the light extracting efficiency of the semiconductor epitaxial stack 3 and promoting the electrical current lateral spreading, wherein the material of the window layer comprises Al, Ga, In, As, P, N or combination thereof, such as GaN and AlGaInP.

Figure 9C:
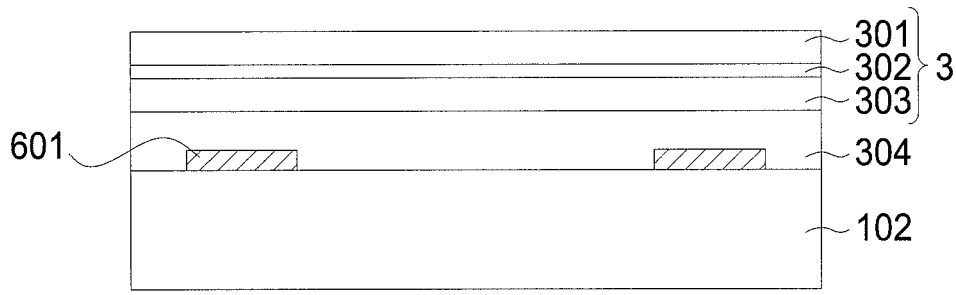

In the next step, as shown in FIG. 9C, the semiconductor epitaxial stack 3 is formed on the semiconductor layer 304. The semiconductor epitaxial stack 3 comprises a first semiconductor layer 301 having a first type conductivity, a converting unit 302 and a second semiconductor layer 303 having a second type conductivity sequentially formed on the growth substrate 102. The first semiconductor layer 301 and the second semiconductor layer 303 both are single-layer structure or multi-layer structure (multi-layer means two or more than two layers). The first semiconductor layer 301 and the second semiconductor layer 303 have different conductive types, different electrical types and different polarities, or are doped with different elements for providing electrons or holes. When the first semiconductor layer 301 is p-type semiconductor, the second semiconductor layer 303 is n-type semiconductor, of which the electrical type is different from that of the p-type semiconductor. On the contrary, when the first semiconductor layer 301 is n-type semiconductor, the second semiconductor layer 303 is p-type semiconductor. The converting unit 302 is formed between the first semiconductor layer 301 and the second semiconductor layer 303. The converting unit 302 is able to mutually convert light into electrical power or electrical power into light. The semiconductor epitaxial stack 3 can be further adopted in a semiconductor device, equipment, product or circuit for mutually converting light into electrical power or electrical power into light. Specifically, the semiconductor epitaxial stack 3 can further form a light-emitting diode (LED), a laser diode (LD), a solar cell or be adopted in a display. Taking the light-emitting diode (LED) as an example, the wavelength of the light emitted can be adjusted by adjusting the combination of one layer or multiple layers of the semiconductor epitaxial stack 3. The material of the semiconductor epitaxial stack 3 comprises aluminum gallium indium phosphide (AlGaInP) series, aluminum gallium indium nitride (AlGaInN) series, or zinc oxide (ZnO) series. The structure of the converting unit 302 comprises single heterostructure (SH), double heterostructure (DH), double-side double heterostructure (DDH) or multi-quantum well (MWQ). Specifically, the converting unit 302 can be intrinsic, p-type or n-type semiconductor. When an electrical current passes through the semiconductor epitaxial stack 3, the converting unit 302 is able to emit a light. As the converting unit 302 is made of aluminum gallium indium phosphide (AlGaInP) series, the light emitted from the converting unit 302 is amber series such as red, orange and yellow. As the converting unit 302 is made of aluminum gallium indium nitride (AlGaInN) series, the light emitted from the converting unit 302 is blue or green.

Figure 9D:
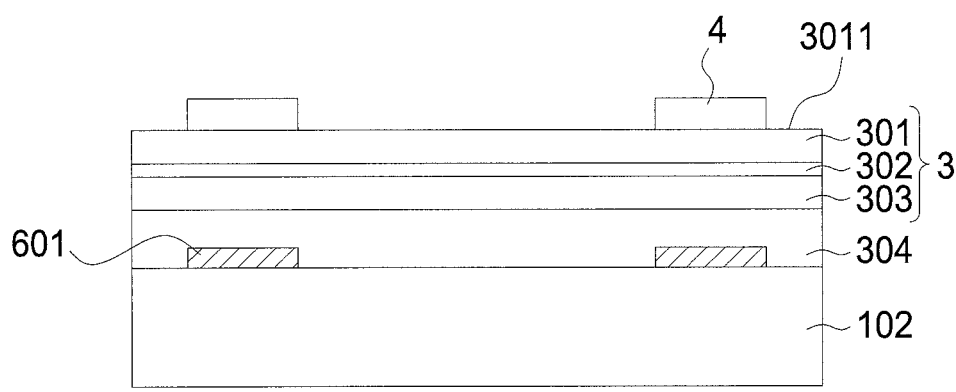

In the next step, as shown in FIG. 9D, a patterned adhesion medium 4 corresponding to the patterned sacrificial layer 601 is formed on the surface 3011 of the semiconductor epitaxial stack 3, wherein the method of forming the patterned adhesion medium 4 comprises forming a layer of adhesion medium layer on the surface 3011 and, then, using photolithography method or etching method to pattern the layer of adhesion medium layer to form the patterned adhesion medium 4, wherein the photolithography method and the patterned etching method are generally semiconductor producing processes. The material of the patterned adhesion medium 4 comprises organic material or inorganic material, wherein the organic material comprises acrylic acid, unsaturated polyester, epoxy, oxetane, vinyl ether, nylon, PP, PBT, PPO, PC, ABS, PVC or BCB, and the inorganic material comprises metal such as Ti, Au, Be, W, Al, Ge, Cu and combination thereof; oxide such as ITO, CTO, ATO, IZO, AZO, ZTO, ZnO and $SiO_x$; or nitride such as $SiN_x$.

Figure 9E:
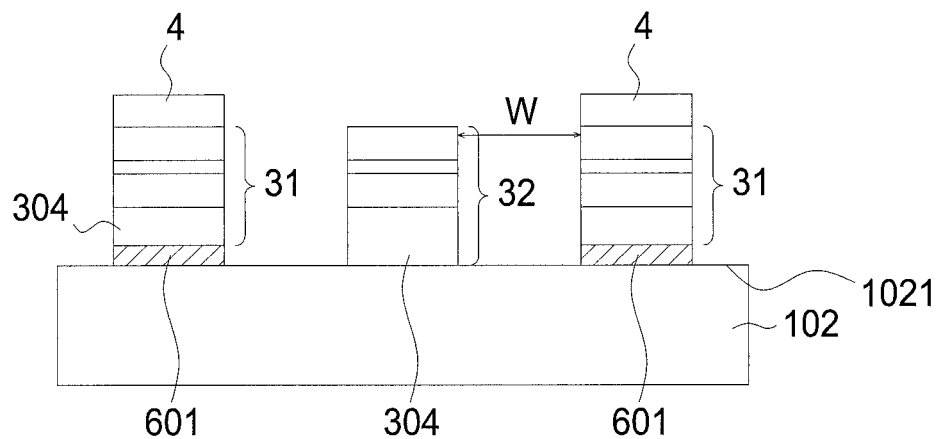

In the next step, as shown in FIG. 9E, the semiconductor epitaxial stack 3 and the semiconductor layer 304 are patterned to reveal the surface 1011, so a plurality of semiconductor epitaxial stacks is formed, wherein the multiple semiconductor epitaxial stacks are separated. The multiple semiconductor epitaxial stacks comprise a first semiconductor epitaxial stack 31 and a second semiconductor epitaxial stack 32, wherein the first semiconductor epitaxial stack 31 has the adhesion medium 4 thereon and the second semiconductor epitaxial stack 32 does not have the adhesion medium 4 on the surface 3011. The method of patterning the semiconductor epitaxial stack 3 and the adhesion structure 2 comprises wet etching or dry etching. In this embodiment, dry etching method is applied to make an interval w between the first semiconductor epitaxial stack 31 and the second semiconductor epitaxial stack 32 as small as possible to prevent epitaxial stack of the semiconductor epitaxial stack 3 from being removed excessively. In this embodiment, the interval w is between 1 μm and 10 μm, or preferably about 5 μm. In this embodiment, the sacrificial layer 601 is between the first semiconductor epitaxial stack 31 and the growth substrate 102 and the second semiconductor epitaxial stack 32 is directly formed on the growth substrate 102, so the adhesion between the semiconductor layer 304 and the sacrificial layer 601 can be smaller than the adhesion between the semiconductor layer 304 and the growth substrate 102 by controlling the processing condition of forming the semiconductor layer 304 or by applying different materials for the sacrificial layer 601 and the semiconductor layer 304, wherein the material of the sacrificial layer 601 comprises oxide.

Figure 9F:
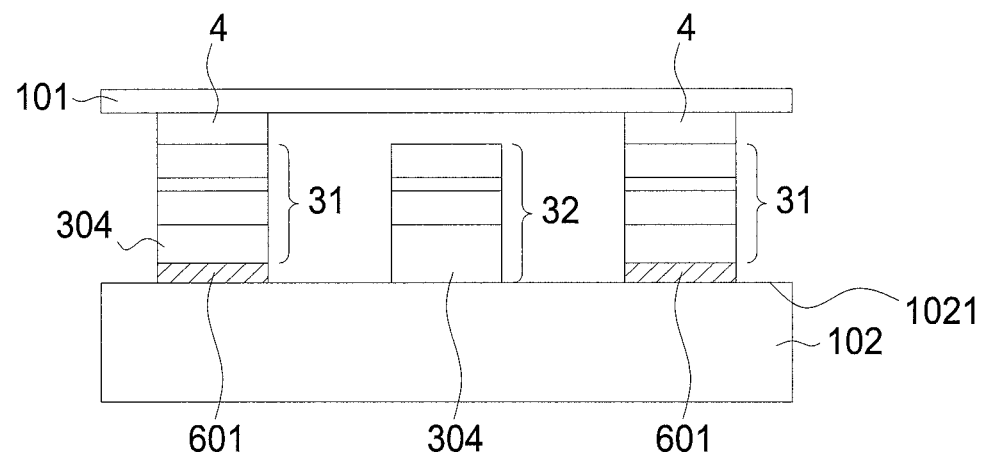

In the next step, as shown in FIG. 9F, a picking unit 103 is provided to stick the adhesion medium 4 by heating, pressing or using stickiness of the picking unit 103. The picking unit 103 comprises electrically-conductive material such as electrically-conductive substrate and printed circuit board, wherein the electrically-conductive substrate comprises semiconductor such as Si, GaAs, SiC, GaN, AlN; oxide such as ZnO; metal or the combination thereof, and the printed circuit board comprises single-sided printed circuit board, double-sided printed circuit board, multi-layers printed circuit board or flexible printed circuit board; or electrically-insulated material such as sapphire, diamond, glass, quartz, acryl, $LiAlO_2$, ceramics, and EPS tape.

In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN) or polyimide (PI), and the supporting structure 1031 comprises hard substrate such as sapphire, diamond, glass, quartz, and acryl for supporting the flexible substrate 1032.

In another embodiment, the patterned adhesion medium 4 is able to be formed on the picking unit 103 in advance. Then, the alignment bonding technology is applied to align the adhesion medium 4 and the first semiconductor epitaxial stack 31 firstly and, then, bond the adhesion medium 4 and the first semiconductor epitaxial stack 31 by heating and pressing.

Figure 9G:
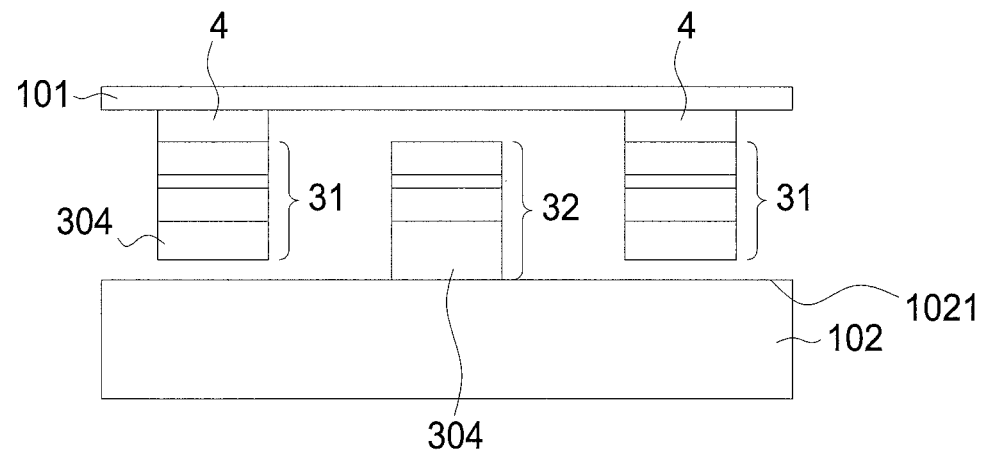
Figure 9H:
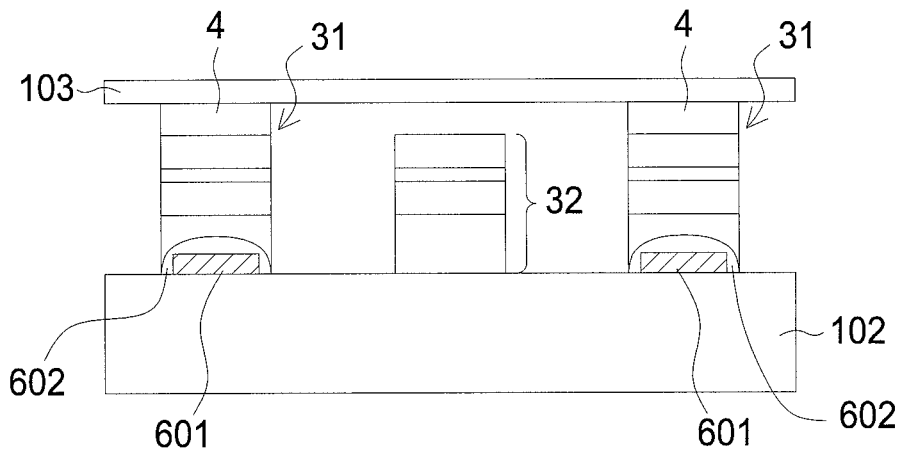
Figure 9I:
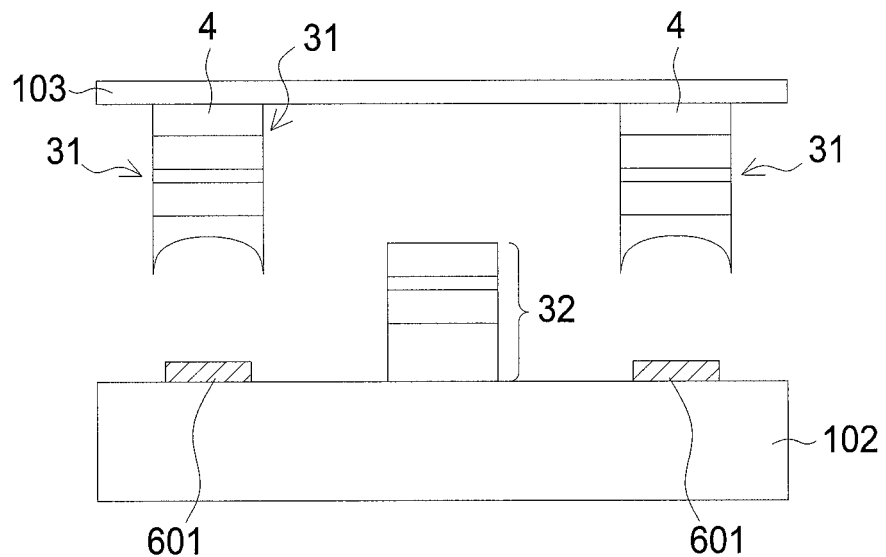

In the next step, as shown in FIG. 9G, when the sacrificial layer 601 is made of $SiO_x$ or AlAs, the sacrificial layer 601 can be removed by wet etching or vapor etching, and then the forces in the opposite directions are directly applied on the picking unit 103 and the growth substrate 102 respectively to separate the first semiconductor epitaxial stack 31 and the sacrificial layer 601. In this embodiment, the etchant used in the wet etching process comprises hydrofluoric (HF) acid, and the chemical material used in the vapor etching process comprises hydrofluoric (HF) vapor. In another embodiment, as shown in FIGS. 9H and 9I, when the sacrificial layer 601 is not made of semiconductor such as $SiO_x$, a pore 602 between the semiconductor layer 304 and the sacrificial layer 601, which decreases the contact area between the semiconductor layer 304 and the sacrificial layer 601, can be formed by controlling the temperature and pressure in the phase of lateral epitaxial growth during epitaxial growth of the semiconductor layer 304. Then, the forces in the opposite directions can be directly applied on the picking unit 103 and the growth substrate 102 respectively to directly separate the first semiconductor epitaxial stack 31 and the sacrificial layer 601.

In another embodiment, as shown in FIG. 11A, the picking unit 103 comprises a flexible substrate 1032 and a supporting structure 1031, wherein the flexible substrate 1032 comprises polyester resin (PET), polyethylene naphthalate (PEN) or polyimide (PI), and the supporting structure 1031 comprises hard substrate such as sapphire, diamond, glass, quartz and acryl, for supporting the flexible substrate 1032.

Tenth Embodiment

Figure 10A:
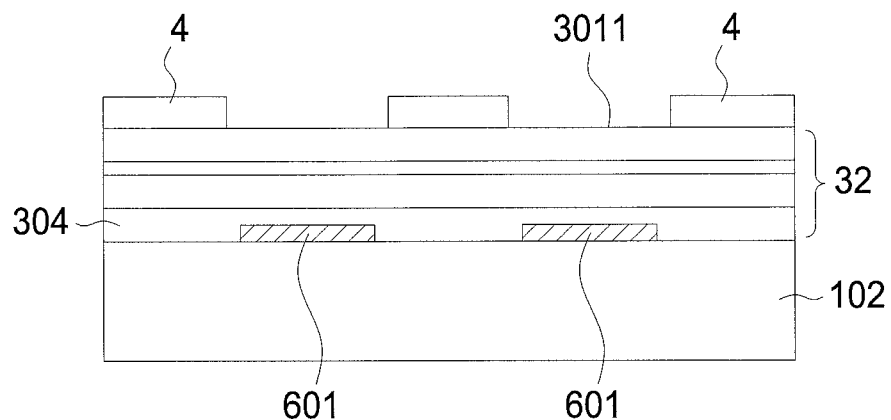
FIGS. 10A to 10C show the structures corresponding to the steps of a manufacturing process according to the tenth embodiment.
Figure 10B:
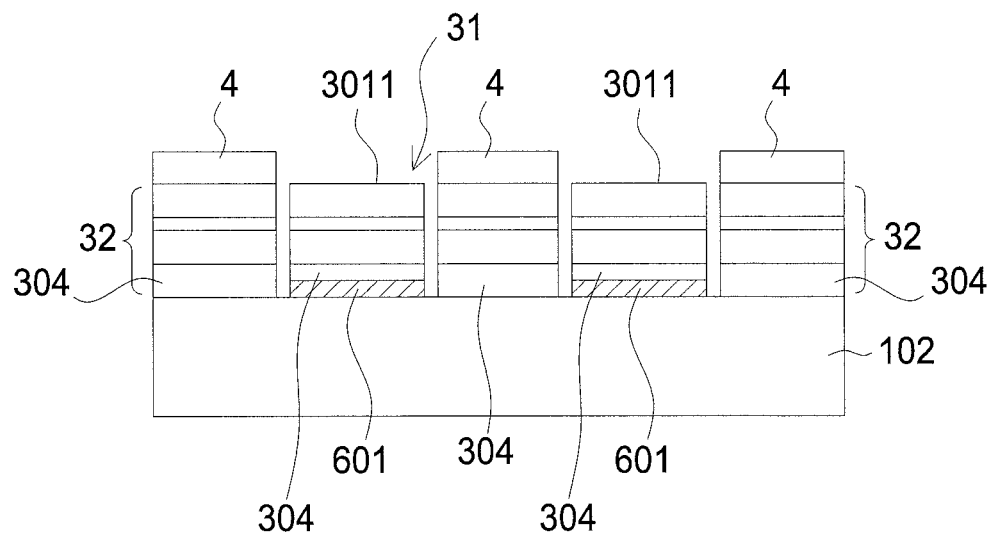
Figure 10C:
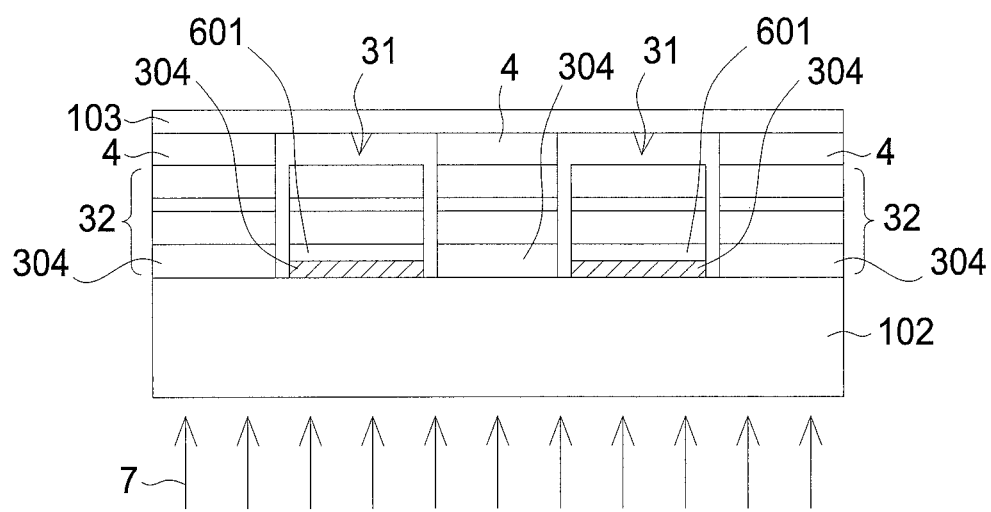

FIGS. 10A to 10C show the structures corresponding to the steps of a manufacturing process according to the tenth embodiment. The difference between the tenth embodiment and the ninth embodiment is that the adhesion medium 4 is on the second semiconductor epitaxial stack 32 and the first semiconductor epitaxial stack 31 exposes the surface 3011. As shown in FIG. 10C, when the semiconductor layer 304 is made of GaN, the sacrificial layer 601 is made of AlN and the growth substrate 102 is a transparent substrate, a laser 7 can irradiate on the semiconductor layer 304 and the sacrificial layer 601 from a surface 1022 of the growth substrate 102 opposite to the semiconductor layer 304 and the sacrificial layer 601 for separating the semiconductor layer 304 of the second semiconductor epitaxial stack 32 from the growth substrate 102, wherein the energy of the laser 7 is larger than the bandgap of GaN and smaller than the bandgap of AlN. Then, the forces in the opposite directions can be directly applied on the picking unit 103 and the growth substrate 102 respectively to directly separate the second semiconductor epitaxial stack 32 from the growth substrate 102.

Eleventh Embodiment

Figure 12A:
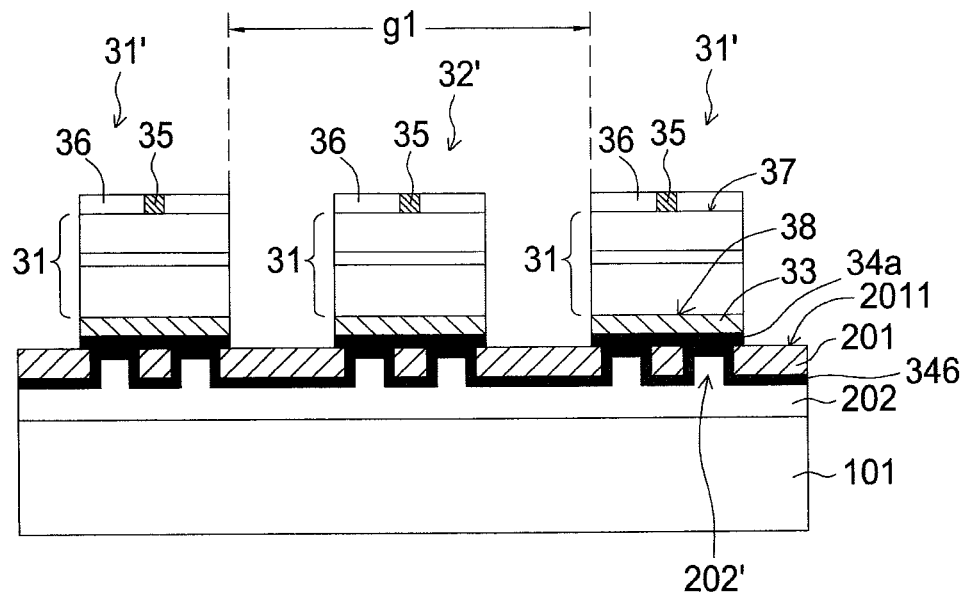
FIGS. 12A to 12D show the structures corresponding to the steps of a manufacturing process according to the eleventh embodiment.

FIGS. 12A to 12D show the structures corresponding to the steps of a manufacturing process according to the eleventh embodiment. As shown in FIG. 12A, multiple semiconductor devices, such as optoelectronic semiconductor devices, comprising a first group semiconductor devices 31' and a second group semiconductor devices 32' are connected to the surface 2011 of the adhesion substrate 101 with the patterned sacrificial layer 201 and the adhesion layer 202. Total number of the semiconductor devices may be more than $1 \times 10^5$, and number of the first group semiconductor devices 31' or the second group semiconductor devices 32' may be more than $1 \times 10^4$. In some embodiments, total number of the semiconductor devices may be more than $1 \times 10^6$, and number of the first group semiconductor devices 31' or the second group semiconductor devices 32' may be more than $1 \times 10^5$. Number of the first group semiconductor devices 31' and the second group semiconductor devices 32' may be the same or different. The first group semiconductor devices 31' and the second group semiconductor devices 32' may be arranged periodically, alternately or randomly on the substrate 101. In the present embodiment, the adhesion layer 202 is formed on the surface 1011 of the adhesion substrate 101 and comprises multiple post portions 202'. A release layer 346 is formed between the adhesion layer 202 and the sacrificial layer 201, wherein the release layer 346 may cover or conformally cover the adhesion layer 202. The release layer 346 comprises transparent conductive layer, such as ITO, CTO, ATO, IZO, AZO, ZTO, ZnO and graphene. The patterned sacrificial layer 201 is formed on the release layer 346 and exposes a portion of the release layer 346 corresponding to the post portions 202'. In the present embodiment, the patterned sacrificial layer 201 and the portion of the release layer 346 corresponding to the multiple post portions 202' jointly form a flat surface 2011. The semiconductor devices 31', 32' contacts the surface 2011, and the post portions 202' are under the semiconductor devices 31', 32'. Specifically, one or more post portions 202' may be sandwiched between each semiconductor devices 31', 32' and the adhesion substrate 101. In the present embodiment, a gap g1 is an initial or the shortest distance between the two neighboring first semiconductor devices 31' or two neighboring second semiconductor devices 32' on the adhesion substrate 101 as shown in FIG. 12A.

The first semiconductor device 31' and the second semiconductor device 32' may comprise the same or different structures. In the present embodiment, each of the first and second semiconductor devices 31', 32' comprises the semiconductor epitaxial stack 31 having a top surface 37 and a lower surface 38 opposite to the top surface 37, an electrode 35 on the center of top surface 37, a transparent insulating layer 36 covering the top surface 37 and exposing the electrode 35, and a magnetism layer 33 formed on the lower surface 38. The magnetism layer 33 may comprise paramagnetic material, such that the magnetism layer 33 can be magnetized to have a magnetic field when a magnetic force is applied on the magnetism layer 33, wherein the magnetic field direction of magnetism layer 33 is the same as that of the magnetic force. Each of the first and second semiconductor devices 31', 32' may further comprise a release layer 34a under the semiconductor epitaxial stack 31 or the magnetism layer 33 for contacting the flat surface 2011. In the present embodiment, the portion of the release layer 346 corresponding to the multiple post portions 202' contacts the release layer 34a of the first and second semiconductor devices 31', 32'. The release layer 34a may comprise transparent conductive layer, such as ITO, CTO, ATO, IZO, AZO, ZTO, ZnO and graphene. The release layer 34a and the release layer 346 may comprise the same or different material.

In the present embodiment, the materials of the adhesion layer 202 and the sacrificial layer 201 may be different. The material of the adhesion layer 202 comprises metal, such as Au, Pt, Cr, Al, Ag, In, Sn and the combination thereof. The material of the sacrificial layer 201 comprises organic material or inorganic material, wherein the organic material comprises UV dissociated glue or thermoplastic material, and the inorganic material comprises oxide or nitride. The UV dissociated glue comprises acrylic acid, unsaturated polyester, epoxy, oxetane or vinyl ether; the thermoplastic comprises nylon, PP, PBT, PPO, PC, ABS or PVC; the oxide comprises $SiO_x$; and the nitride comprises $SiN_x$. In addition, the electrode 35 comprises Au, Al, Ge, Ni, Ti, Pt, Be or the combination thereof. The transparent insulating layer 36 comprises $SiO_x$, $SiN_x$, SiON, $Al_2O_3$ or the combination thereof.

Figure 13:
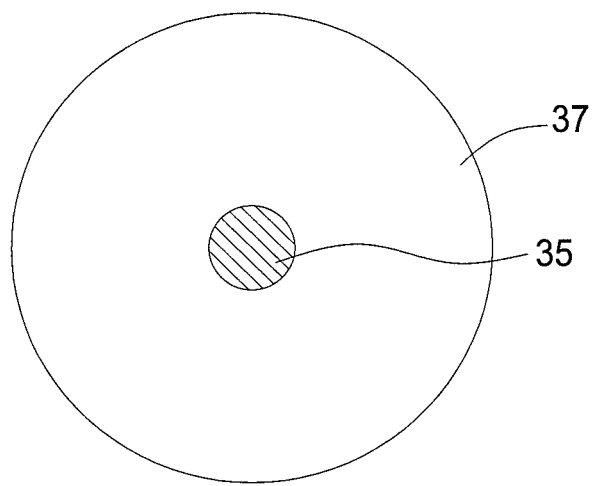
FIG. 13 shows a top view of a semiconductor device according to another embodiment of the present disclosure.

According to another embodiment of the present disclosure, in a top view of the semiconductor device 31', 32' as shown in FIG. 13, a shape of the top surface 37 may be circle and the electrode 35 may be on the center of top surface 37. In another embodiment, the area ratio of the electrode 35 to the top surface 37 may be lower than 10%, preferably lower than 2%. In another embodiment, the area of the top surface 37 may be about 625 μm² to 1 mm². In another embodiment, the shape of the top surface 37 may be square, rectangle or polygon.

Figure 16:
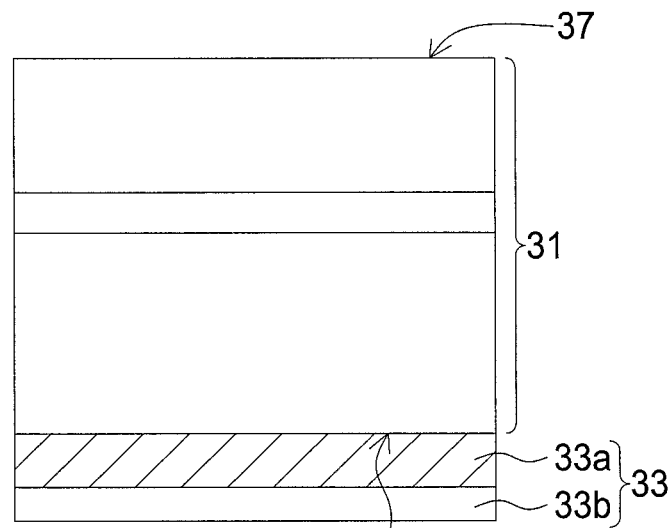
FIG. 16 shows the structure of a semiconductor device according to another embodiment of the present disclosure.

According to another embodiment of the present disclosure, as shown in FIG. 16, the magnetism layer 33 may comprise a magnetic layer 33a and a bonding layer 33b, wherein the magnetic layer 33a is between the semiconductor epitaxial stack 31 and the bonding layer 33b. The material of the magnetic layer 33a and the bonding layer 33b may comprise Au, Be, Al, Ge, Ni, Ti, Pt, Ni, Co, Fe or the combination thereof.

Figure 12B:
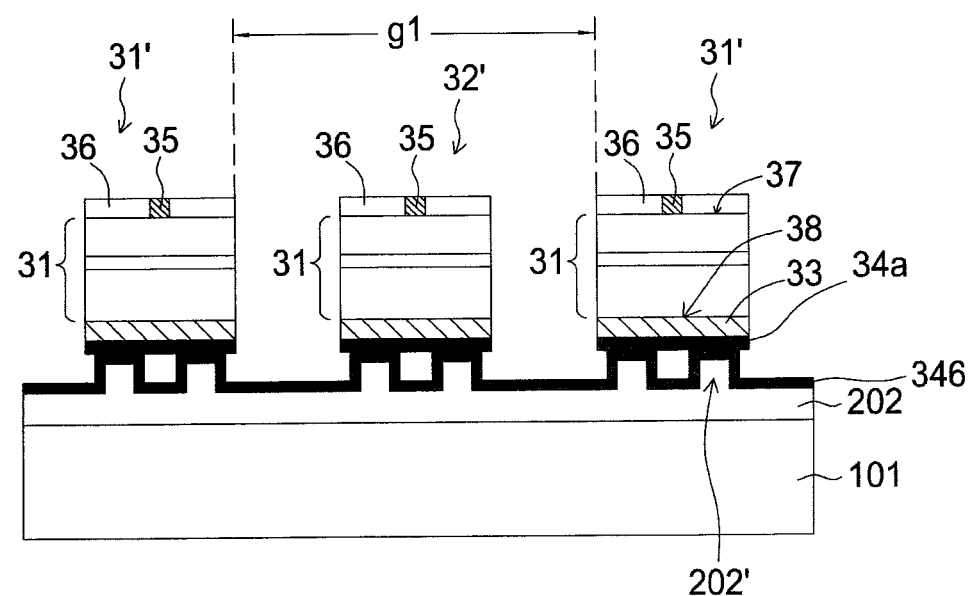

Then, as shown in FIG. 12B, the sacrificial layer 201 is removed to expose the release layer 346. The first and second semiconductor devices 31', 32' are supported by the post portions 202' of the adhesion layer 202. The method for removing the sacrificial layer 201 comprises irradiating UV light, wet etching or heating.

Figure 12C:
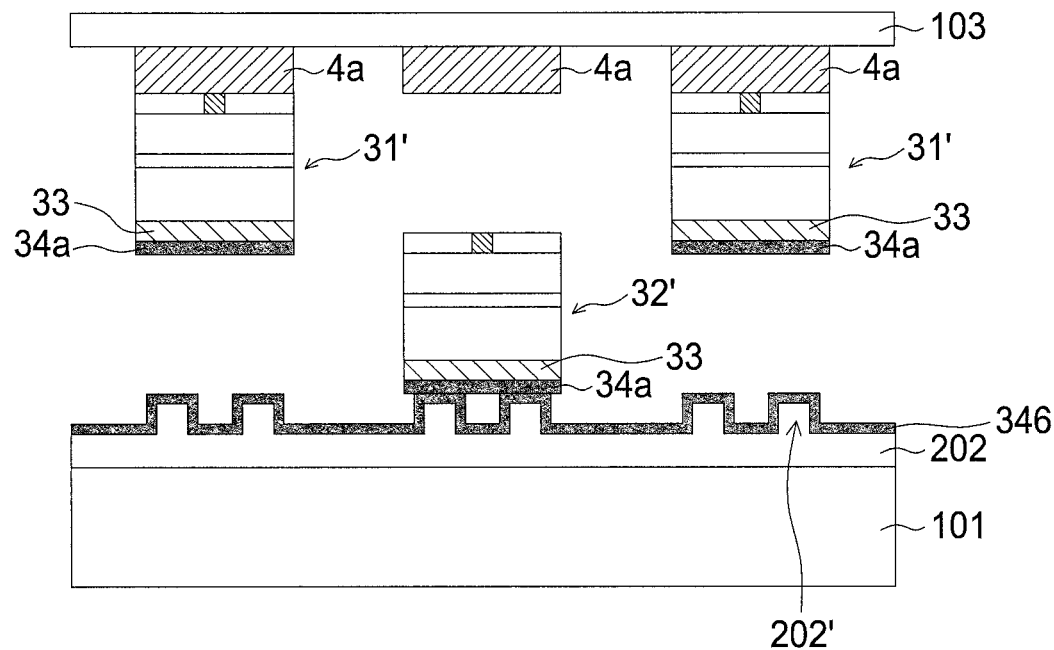
Figure 17A:
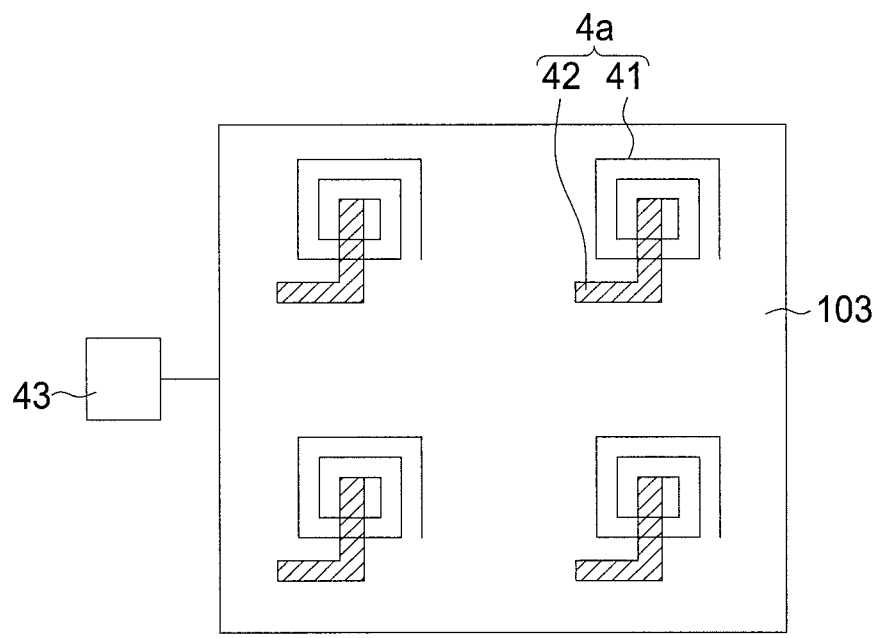
FIGS. 17A and 17B show a schematic diagram of the picking unit according to another embodiment of the present disclosure.
Figure 17B:
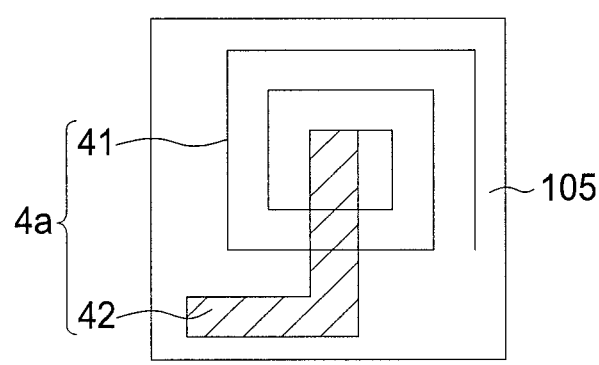

Then, as shown in FIG. 12C, a picking unit 103 is provided to pick up the first semiconductor devices 31' and leave the second semiconductor device 32' on the adhesion substrate 101. In the present embodiment, multiple magnetic devices 4a are formed on or coupled with the picking unit 103 and corresponding to the first group semiconductor devices 31', the second group semiconductor devices 32' or both. In another embodiment of the present disclosure as shown in FIG. 17A, the magnetic device 4a on the picking unit 103 may comprise an electromagnet circuit 41 and a control circuit 42 connecting the electromagnet circuit 41. A control unit 43 connects the control circuits 42 for controlling the magnetic devices 4a. The magnetic devices 4a on the picking unit 103 may be controlled by the control unit 43 independently, singly, groupingly or simultaneously. After the control unit 43 receiving an off-instruction or off-signal, the control unit 43 may change one or more the magnetic devices 4a into off-mode which means providing zero or low magnetic force. After the control unit 43 receiving an on-instruction or on-signal, the control unit 43 may change one or more the magnetic devices 4a into active-mode which means providing non-zero or relative high magnetic force. As shown in FIG. 12C, for example, the picking unit 103 is provided near the adhesion substrate 101, wherein the magnetic devices 4a corresponding to the first semiconductor devices 31' are in active-mode and the magnetic device 4a corresponding to the second semiconductor device 32' is in off-mode according to an instruction signal received by the control unit 43. The active-mode magnetic devices 4a may attract the first semiconductor devices 31' to separate the first semiconductor devices 31' and the release layer 346, and the first semiconductor devices 31' are lifted by the picking unit 103. The off-mode magnetic device 4a corresponding to the second semiconductor device 32' may provide no attraction to the second semiconductor device 32', such that the second semiconductor device 32' is remained on the adhesion substrate 101 and adhering with the release layer 346.

Figure 12D:
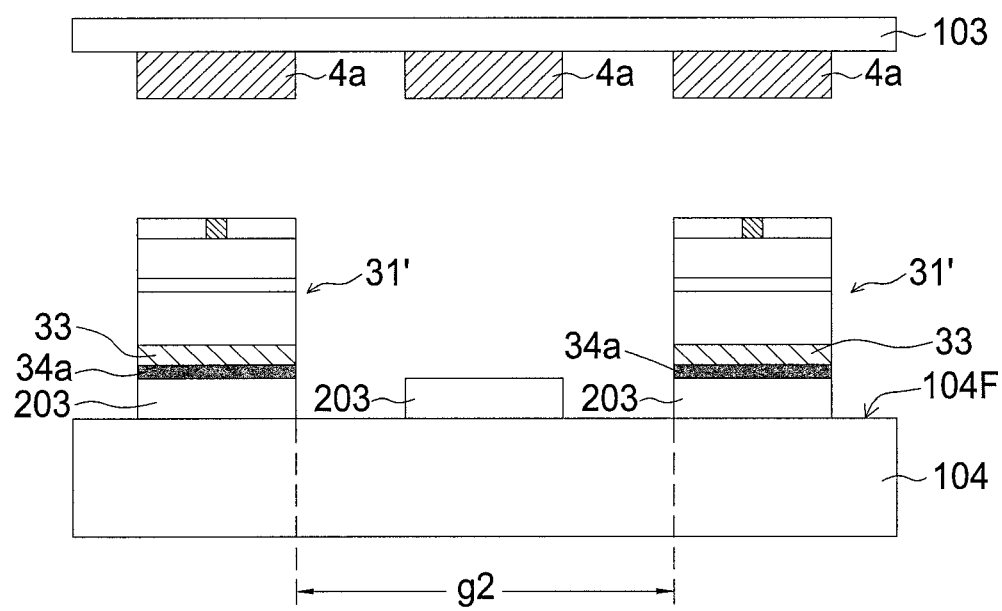

Then, the picking unit 103 with the first semiconductor devices 31' or a substrate 104 is relatively moved to a position where the picking unit 103 is above a front side surface 104F of a substrate 104, wherein the substrate 104 comprises multiple terminals 203 on thereof. The picking unit 103 or the substrate 104 is controlled to align the first semiconductor devices 31' on the picking unit 103 and the corresponding terminals 203. And, the picking unit 103 or the substrate 104 is relatively moved until the release layers 34a of the first semiconductor devices 31' on the picking unit 103 contact the terminals 203. The movements of the picking unit 103 and the substrate 104 may be at the same time or in sequence. Then, a bonding process is provided to bond the release layers 34a and the terminals 203. The terminals 203 may comprise transparent conductive layer, metal or electrically conductive glue, such as ITO, CTO, ATO, IZO, AZO, ZTO, ZnO, graphene, Au, In, Sn, Ni, Ti, Pt, W, Co, Fe, ACF and SAP. The bonding process may comprise heating process, pressing process or both. The substrate 104 may comprise an electrically-insulated substrate, electrically-conductive substrate, integrated circuit or printed circuit board (PCB). Then, as shown in FIG. 12D, the magnetic device 4a is changed into off-mode without providing magnetic force to release the first semiconductor devices 31' on the picking unit 103, and the picking unit 103 is lifted and leaving the first semiconductor devices 31' bonded on the substrate 104. However, the sequence of the steps of the method may be changed according to another embodiments in the present disclosure, for example the bonding step and the release step shown in FIG. 12D may be exchanged, that the picking unit 103 or the substrate 104 may be relatively moved until the release layers 34a of the first semiconductor devices 31' on the picking unit 103 almost contact the corresponding terminals 203, then the magnetic device 4a is changed into off-mode without providing magnetic force to release the first semiconductor devices 31' on the picking unit 103 and make the first semiconductor devices 31' contact the corresponding terminals 203, and then the bonding process is provided to bond the release layers 34a and the terminals 203. A gap g2 is a predetermined or the shortest distance between the two neighboring first semiconductor devices 31' mounted on the substrate 104. In the present embodiment, a difference between the gap g1 and the gap g2 is smaller than 10 μm, and preferably is smaller than 1 μm and larger than 1 nm.

Twelfth Embodiment

Figure 14A:
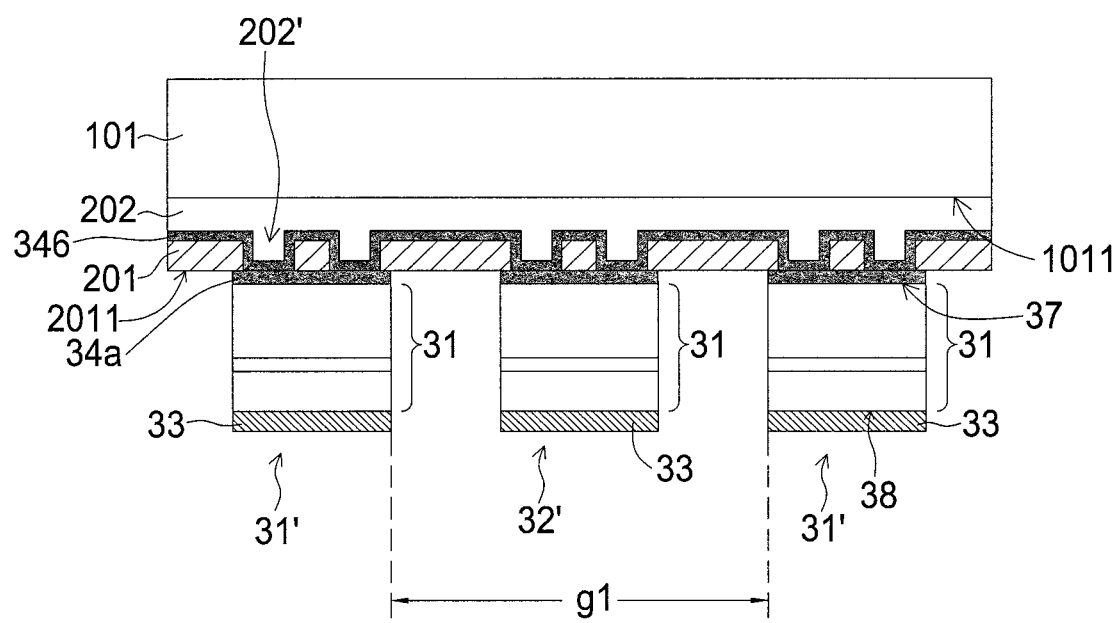
FIGS. 14A to 14C show the structures corresponding to the steps of a manufacturing process according to the twelfth embodiment.
Figure 14B:
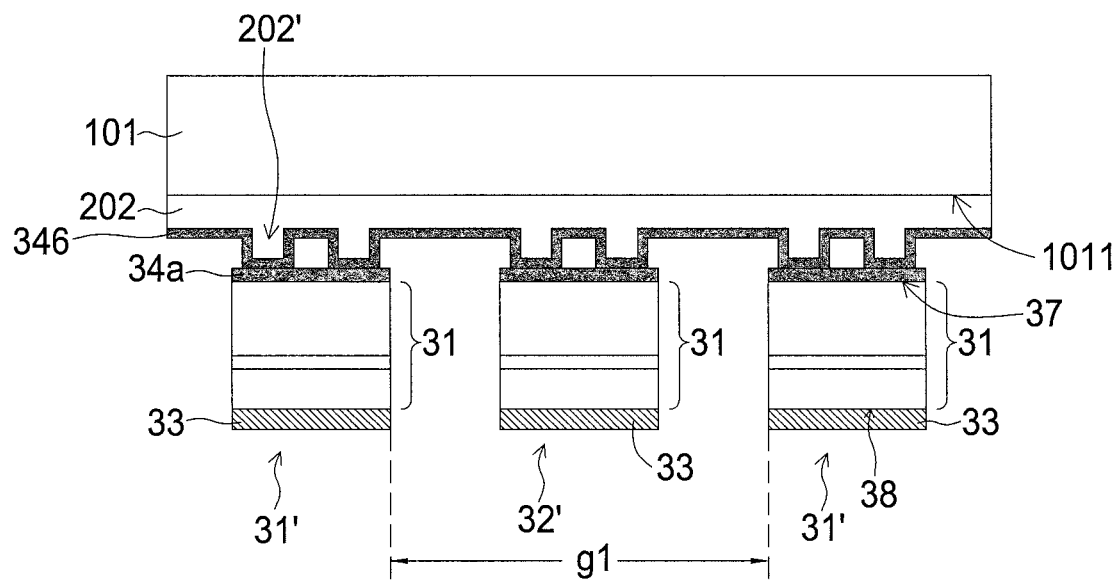
Figure 14C:
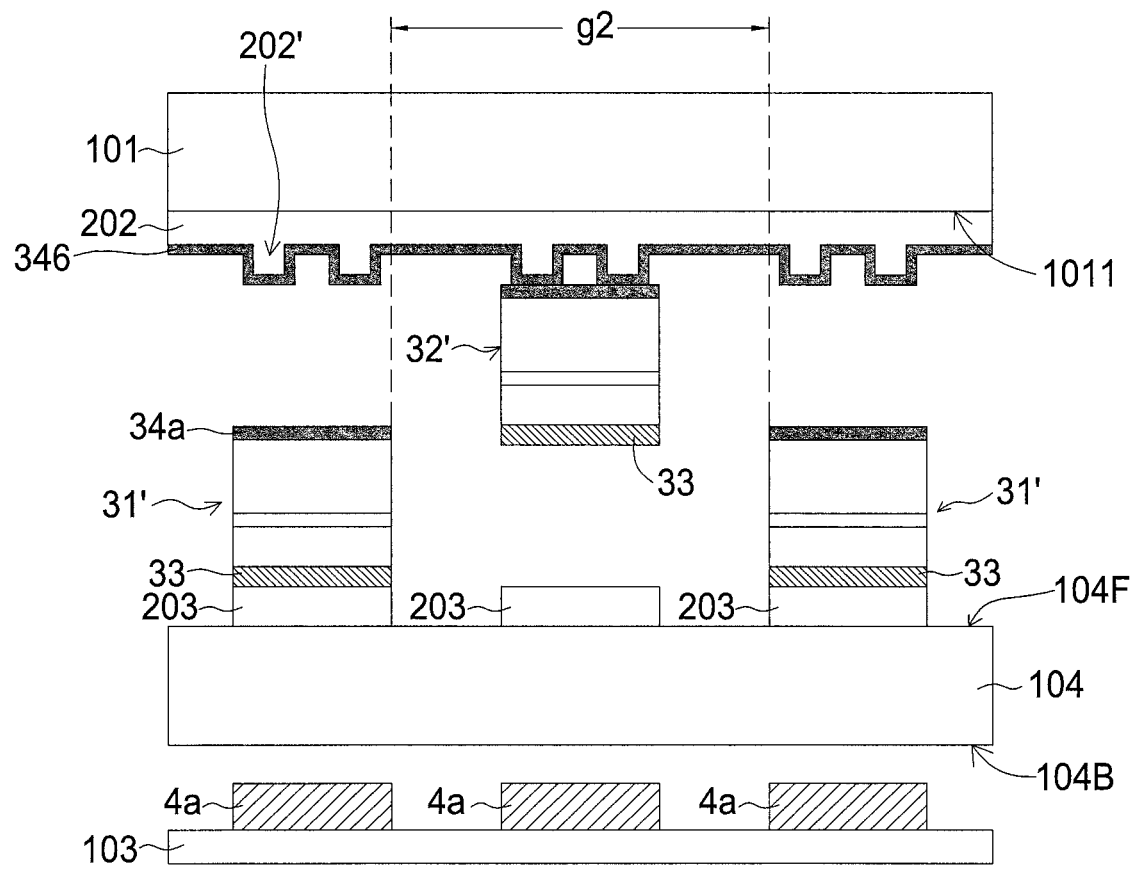

FIGS. 14A to 14C show the structures corresponding to the steps of a manufacturing process according to the twelfth embodiment. As shown in FIG. 14A, multiple semiconductor devices comprising a first group semiconductor devices 31' and a second group semiconductor devices 32' are connected to the surface 101l of the adhesion substrate 101 with the patterned sacrificial layer 201 and the adhesion layer 202. Total number of the semiconductor devices may be more than $1 \times 10^5$, and number of the first group semiconductor devices 31' or the second group semiconductor devices 32' may be more than $1 \times 10^4$. In some embodiments, total number of the semiconductor devices may be more than $1 \times 10^6$, and number of the first group semiconductor devices 31' or the second group semiconductor devices 32' may be more than $1 \times 10^5$. Number of the first group semiconductor devices 31' and the second group semiconductor devices 32' may be the same or different. The first group semiconductor devices 31' and the second group semiconductor devices 32' may be arranged periodically, alternately or randomly on the substrate 101. In the present embodiment, the adhesion layer 202 is formed on the surface 101I of the adhesion substrate 101 and comprises multiple post portions 202'. A release layer 346 is formed between the adhesion layer 202 and the sacrificial layer 201, wherein the release layer 346 may cover or conformally cover the adhesion layer 202. The release layer 346 comprises transparent conductive layer, such as ITO, CTO, ATO, IZO, AZO, ZTO, ZnO and graphene. The patterned sacrificial layer 201 is formed on the releasing layer and exposes a portion of the release layer 346 corresponding to the post portions 202'. In the present embodiment, the patterned sacrificial layer 201 and the portion of the release layer 346 corresponding to the post portions 202' jointly form a flat surface 201I. The semiconductor devices 31', 32' contacts the surface 201I, and the semiconductor devices 31', 32' are under the post portions 202'. Specifically, one or more post portions 202' may be sandwiched between each semiconductor devices 31', 32' and the substrate 101. In the present embodiment, a gap g1 is an initial or the shortest distance between the two neighboring first semiconductor devices 31' or two neighboring second semiconductor devices 32' on the adhesion substrate 101 as shown in FIG. 14A.

In the present embodiment, the first semiconductor device 31', and the second semiconductor device 32' may comprise the same or different structures. Each of the first and second semiconductor devices 31', 32' comprises the semiconductor epitaxial stack 31 having a top surface 37, a lower surface 38 opposite to the top surface 37, an a magnetism layer 33 on the lower surface 38, and a release layer 34a formed on the top surface 37 for contacting the flat surface 201I. The release layer 34a and the magnetism layer 33 may ohmically contact the semiconductor epitaxial stack 31 for conducting an electrical current following through thereof. The release layer 34a comprises transparent conductive layer, such as ITO, CTO, ATO, IZO, AZO, ZTO, ZnO and graphene. In the present embodiment, the release layer 34a and the release layer 346 may comprise the same or different material.

According to another embodiment of the present disclosure, as shown in FIG. 16, the magnetism layer 33 may comprise a magnetic layer 33a and a bonding layer 33b, wherein the magnetic layer 33a is between the semiconductor epitaxial stack 31 and the bonding layer 33b. The material of the magnetic layer 33a and the bonding layer 33b may comprise Au, Be, Al, Ge, Ni, Ti, Pt, Ni, Co, Fe or the combination thereof. The magnetism layer 33 may comprise paramagnetic material, such that the magnetism layer 33 can be magnetized to have a magnetic field when a magnetic force is applied on the magnetism layer 33, wherein the magnetic field direction of magnetism layer 33 is the same as that of the magnetic force.

In the present embodiment, the materials of the adhesion layer 202 and the sacrificial layer 201 may be different. The material of the adhesion layer 202 comprises metal, such as Au, Pt, Cr, Al, Ag, In, Sn and the combination thereof. The material of the sacrificial layer 201 comprises organic material or inorganic material, wherein the organic material comprises UV dissociated glue or thermoplastic material, and the inorganic material comprises oxide or nitride. The UV dissociated glue comprises acrylic acid, unsaturated polyester, epoxy, oxetane or vinyl ether, the thermoplastic comprises nylon, PP, PBT, PPO, PC, ABS or PVC; the oxide comprises SiOx; and the nitride comprises SiNx.

Then, as shown in FIG. 14B, the sacrificial layer 201 is removed to expose the release layer 346. The first and second semiconductor devices 31', 32' are coupling with the post portions 202' of the adhesion layer 202. The method for removing the sacrificial layer 201 comprises irradiating UV light, wet etching or heating.

Then, as shown in FIG. 14C, a picking unit 103 is provided on a back side surface 104B of a substrate 104 opposite to the substrate 101, wherein the substrate 104 comprises multiple terminals 203 on a front side surface 104F of the substrate 104 and facing the first and second semiconductor devices 31', 32' on the substrate 101. At least two of the picking unit 103, the substrate 104 and the substrate 101 are controlled to align the first semiconductor devices 31' on the substrate 101, the corresponding terminals 203 of the substrate 104 and corresponding magnetic devices 4a on the picking unit 103. And, the picking unit 103 or the substrate 104 is relatively moved to close to the each other, and there may be a space between each of the magnetic devices 4a and the back side surface 104B of the substrate 104. And, the substrate 101 or the substrate 104 may be relatively moved to make the first semiconductor devices 31' stay near the corresponding terminals 203, means that there may be a space between the first semiconductor device 31' and the corresponding terminal 203. The movements of the picking unit 103, the substrate 101 and the substrate 104 may be at the same time or in sequence. In the present embodiment, the terminals 203 may comprise transparent conductive layer, metal or electrically conductive glue, such as ITO, CTO, ATO, IZO, AZO, ZTO, ZnO, graphene, Au, In, Sn, Ni, Ti, Pt, W, Co, Fe, ACF and SAP. The substrate 104 may comprise an electrically-insulated substrate, electrically-conductive substrate, integrated circuit or printed circuit board (PCB).

Then, when the magnetic devices 4a are moved to near the back side surface 104B of the substrate 104, the magnetic devices 4a corresponding to the first semiconductor devices 31' are changed into active-mode according to an instruction signal received by the control unit 43, and the magnetism layers 33 of the first semiconductor devices 31' are magnetized to have the same magnetic field direction with the corresponding active-mode magnetic devices 4a. Thus, the first semiconductor devices 31' are attracted by the corresponding active-mode magnetic devices 4a, and the attracted first semiconductor devices 31' are separated from the adhesion substrate 101 to be placed on the corresponding terminal 203, wherein the second semiconductor device 32' is remained on the substrate 101 because its corresponding magnetic device 4a is in off-mode according to the instruction signal.

In one embodiment, the terminals 203 and the magnetism layers 33 may comprise paramagnetic material, such that the terminals 203 and the magnetism layers 33 of the semiconductor devices 31', 32' may be magnetized by the corresponding active-mode magnetic devices 4a at the same time, wherein the magnetized terminals 203 and the magnetized magnetism layers 33 of the semiconductor devices 31', 32' have the same magnetic field direction, which means the magnetized terminals 203 and the magnetized magnetism layers 33 of the semiconductor devices 31', 32' are able to be attracted to each other until the magnetic field thereof disappearing, then the magnetized semiconductor devices 31', 32' can be self-aligned with the corresponding terminals 203 during the process of the semiconductor devices 31', 32' falling to the corresponding terminals 203. Before the magnetic field of or the magnetic attraction between the magnetized terminals 203 and the magnetized magnetism layers 33 disappearing, a connecting process, such as reflow process, gluing process and ultrasonic welding, can be implemented to physically connect the semiconductor devices 31', 32' and the corresponding terminals 203.

A gap g2 is a predetermined or the shortest distance between the two neighboring semiconductor devices 31' or two neighboring semiconductor devices 32' mounted on the substrate 104. In the present embodiment, a difference between the gap g1 and the gap g2 is smaller than 10 μm, and preferably is smaller than 1 μm and larger than 1 nm.

Thirteenth Embodiment

FIGS. 15A to 15F show the structures corresponding to the steps of a manufacturing process according to the thirteenth embodiment. The process steps shown in FIGS. 15A and 15B of this embodiment are the same as those in the twelfth embodiment.

Figure 15A:
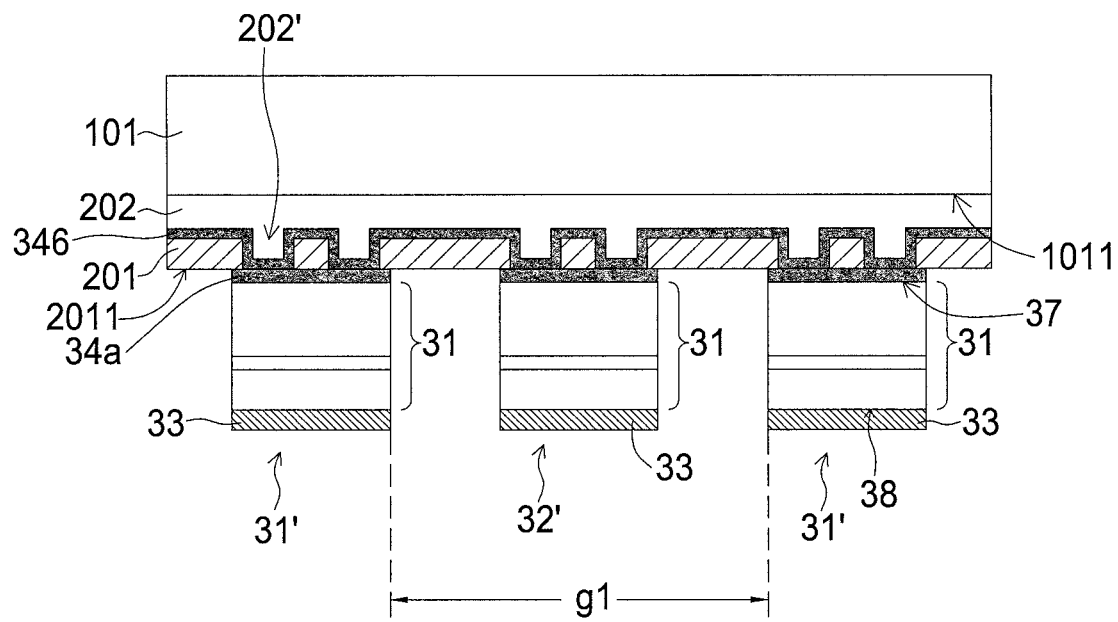
FIGS. 15A to 15F show the structures corresponding to the steps of a manufacturing process according to the thirteenth embodiment.
Figure 15B:
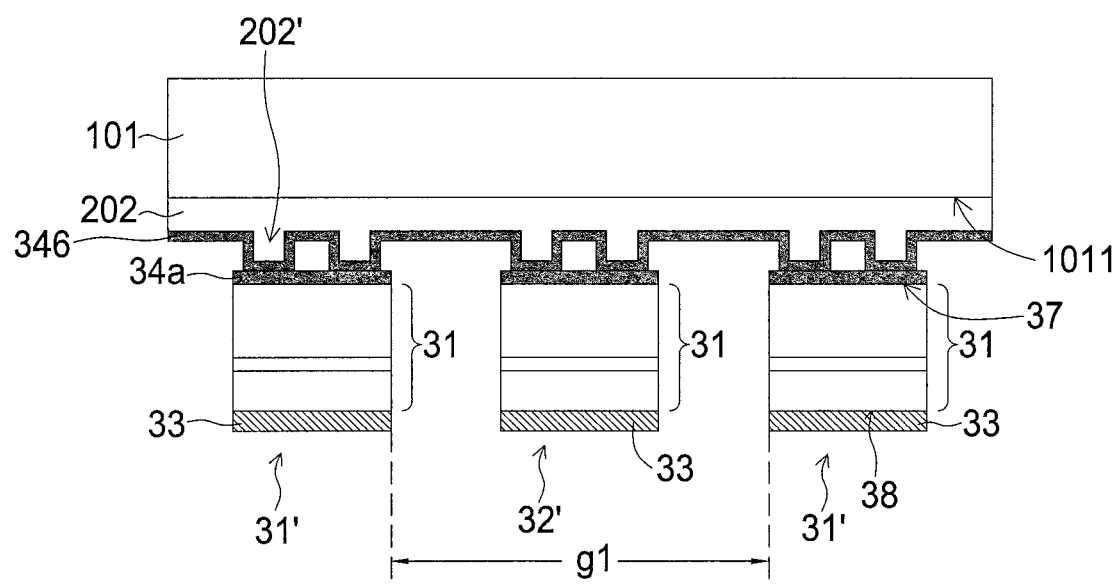
Figure 15C:
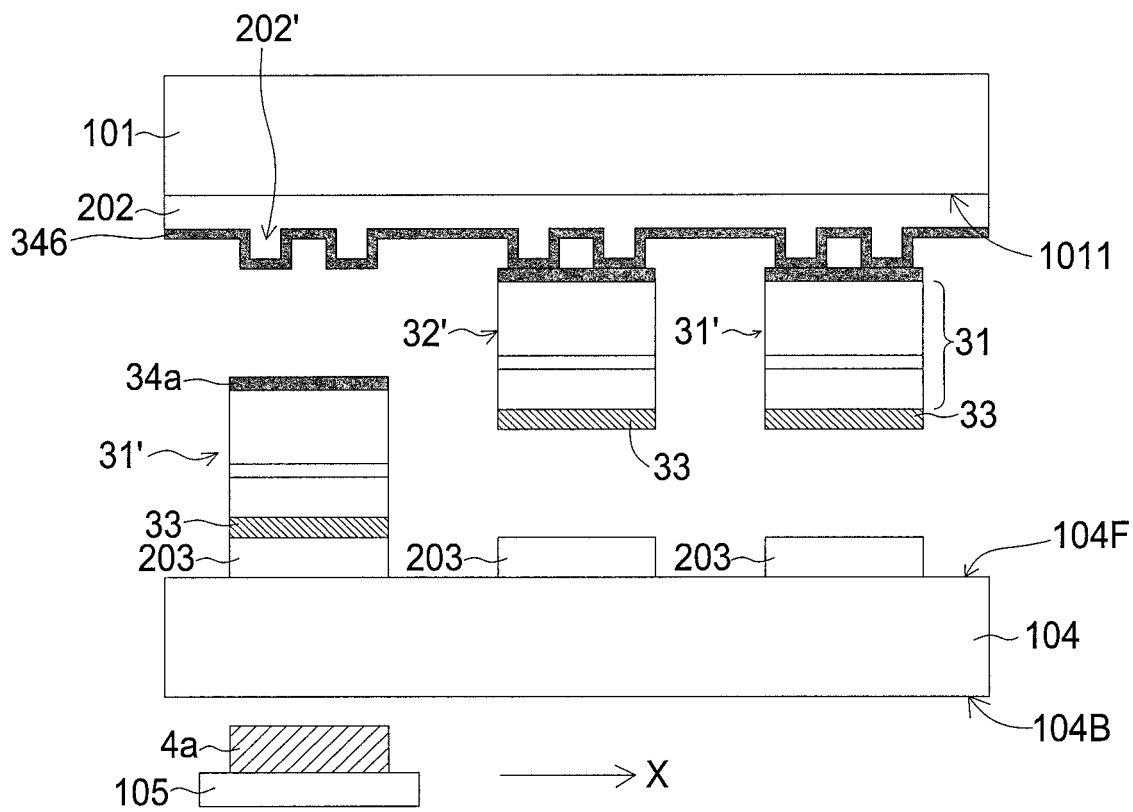

As shown in FIG. 15C, the substrate 104 comprises multiple terminals 203 on the front side surface 104F and facing the semiconductor devices 31', 32'. The structure and material of the substrate 104 and the terminals 203 are the same as those in the twelfth embodiment.

A picking unit 105 is moved to a position above a back side surface 104B of a substrate 104. In the present embodiment, the picking unit 105 may be smaller than the substrate 104, and the picking unit 105 or the substrate 104 can be relatively moved along a direction X which is substantially parallel to the back side surface 104B of the substrate 104. The picking unit 105 comprises one or more magnetic devices 4a on thereof, wherein the magnetic devices 4a can be stacked as a single magnetic device in the picking unit 105 (not shown) or distributed as an array as shown in FIG. 17A.

In the present embodiment, the magnetic device 4a may be in off-mode without providing magnetic force according to an initial signal. When the picking unit 105 is moved to the position corresponding to the first semiconductor device 31' on the substrate 101, the magnetic device 4a is changed into active-mode for providing magnetic force to attract the corresponding first semiconductor device 31' to separate from the adhesion substrate 101 according to an instruction signal received by the control unit 43. More specifically, when the active-mode magnetic device 4a provides magnetic force, the magnetism layer 33 of the first semiconductor device 31' and the terminal 203 corresponding to the active-mode magnetic device 4a are magnetized and have the same magnetic field direction. And, the first semiconductor device 31' can be attracted by both the corresponding active-mode magnetic device 4a and the corresponding terminal 203. Then, the attracted semiconductor device 31' is separated from the adhesion substrate 101 to be placed on and attracted by the corresponding terminal 203. Then, the magnetic device 4a may be changed into off-mode or stayed in active-mode, and moved to another location as shown in FIG. 15D or FIG. 15E.

Figure 15D:
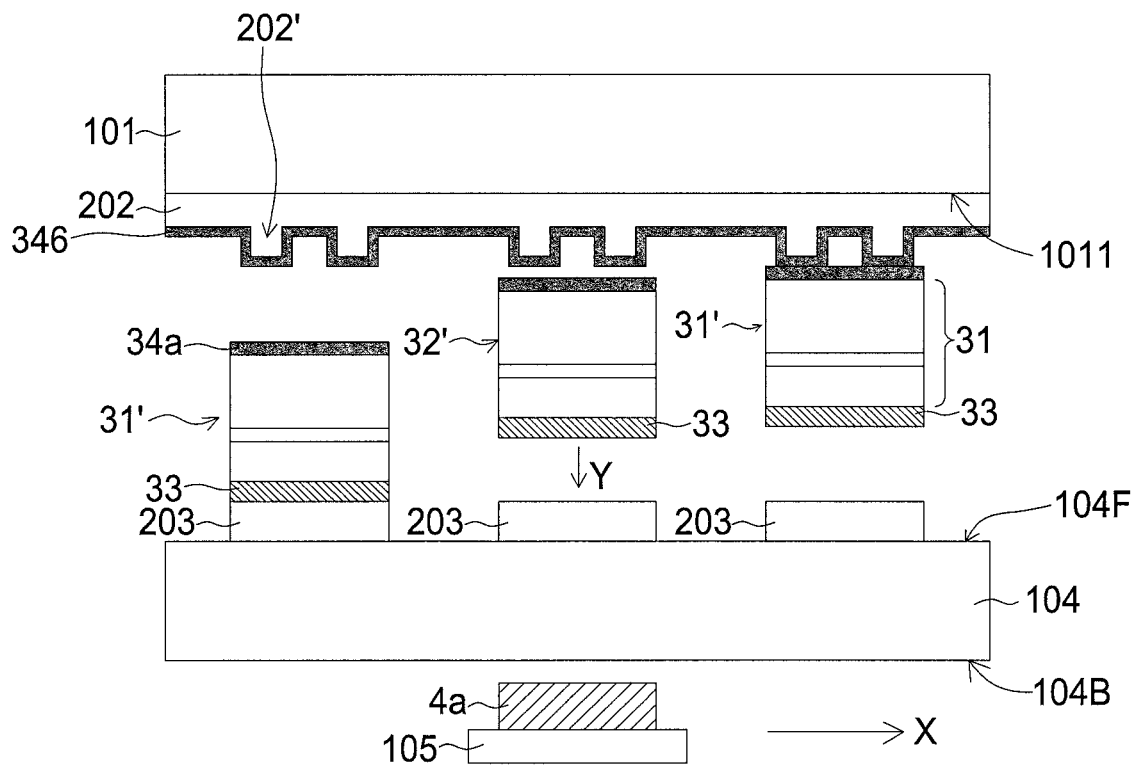

Next, as shown in FIG. 15D, the picking unit 105 is moved to the position corresponding to the second semiconductor device 32' neighbor the prior separated first semiconductor device 31', and the magnetic device 4a may be changed into active-mode, if the magnetic device 4a is in off-mode before the change, and attract the second semiconductor device 32' to separate from the substrate 101 to make the attracted second semiconductor device 32' be placed on the corresponding terminal 203 by the magnetic force there between. Then, the magnetic device 4a may be changed into off-mode and moved to another location according to the control signal from the control unit 43. In other words, the picking unit 105 with the magnetic device 4a is able to transfer the semiconductor devices 31', 32' from the adhesion substrate 101 to the substrate 104 in sequence.

Figure 15E:
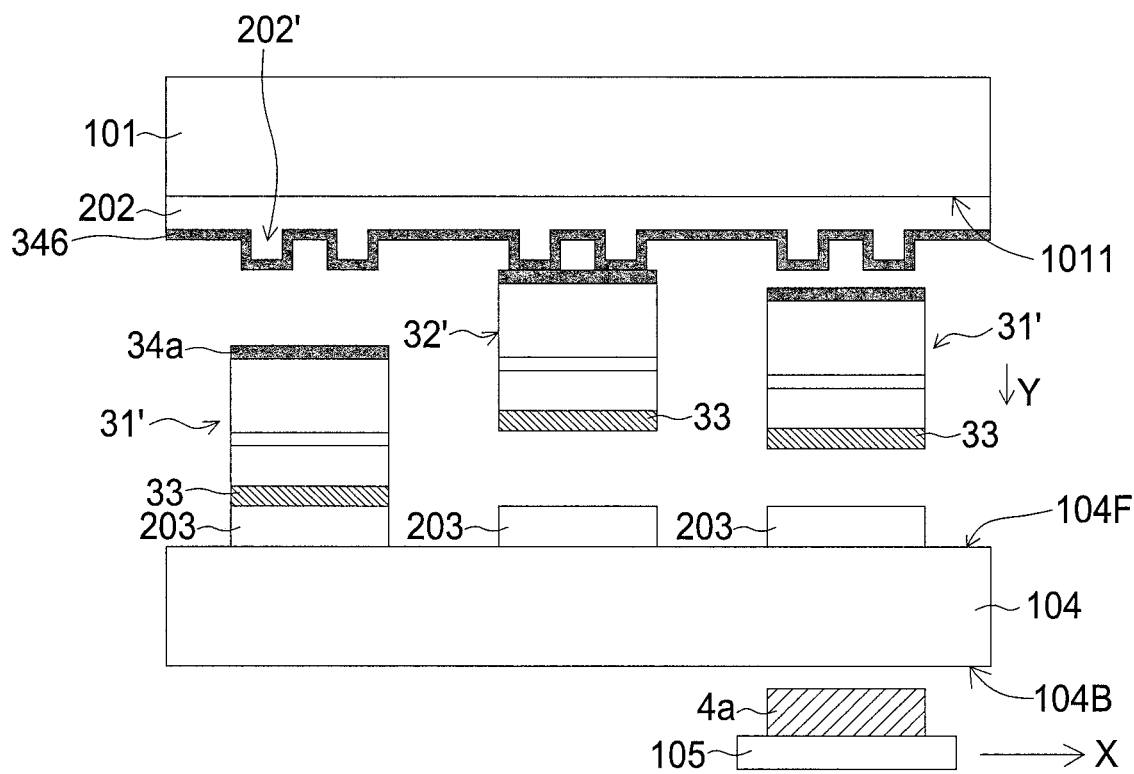

In another embodiment, as shown in FIG. 15E, the second semiconductor device 32' may not be transferred to the substrate 104 according to the instruction signal received by the control unit 43. More specifically, when the picking unit 105 is moved to pass the position corresponding to the second semiconductor device 32' neighbor the prior separated first semiconductor device 31', the magnetic device 4a may be still in off-mode or changed into off-mode. Then, the picking unit 105 is moved to the position corresponding to another first semiconductor device 31', and the magnetic device 4a is changed into active-mode for transferring the target first semiconductor devices 31' from the substrate 101 to the substrate 104. In other words, the picking unit 105 with the magnetic device 4a is able to transfer the designated semiconductor devices 31', 32' from the substrate 101 to the substrate 104 in sequence, or transfer the semiconductor devices 31', 32' from the substrate 101 to the substrate 104 alternately, by controlling the magnetic device 4a on the picking unit 105.

Figure 15F:
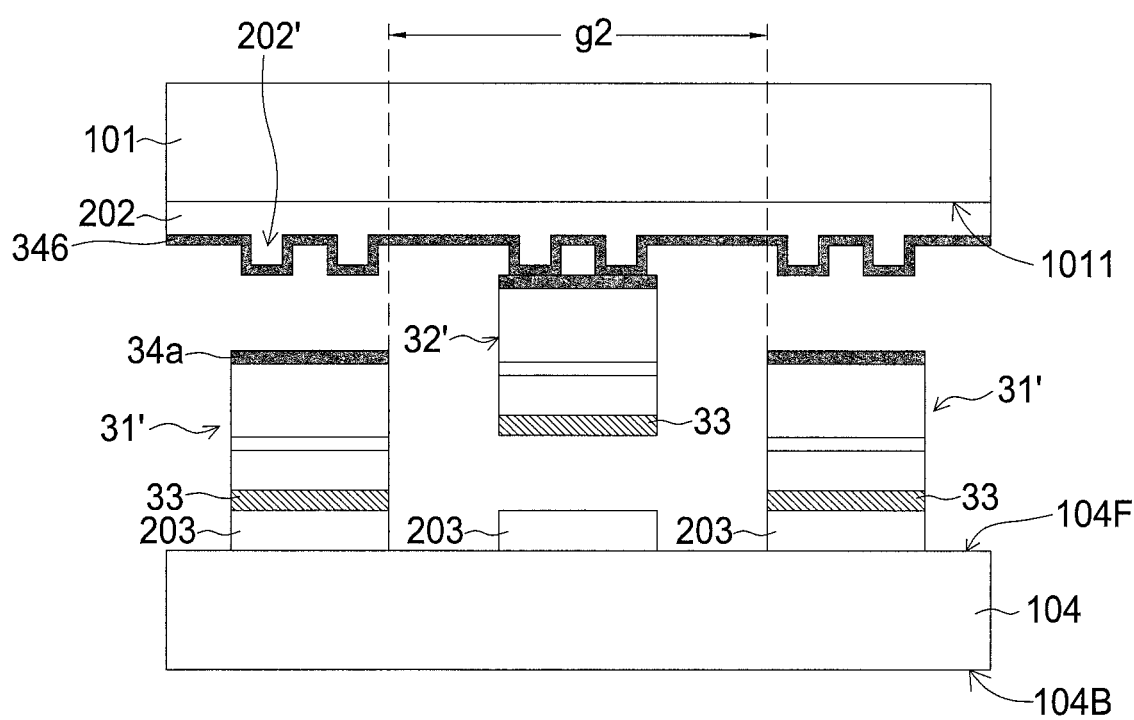

As shown in FIG. 15F, A gap g2 is a predetermined or the shortest distance between the two neighboring first semiconductor devices 31' or two neighboring second semiconductor devices 32' mounted on the substrate 104. In the present embodiment, a difference between the gap g1 and the gap g2 is smaller than 10 μm, and preferably is smaller than 1 μm and larger than 1 nm.

Fourteenth Embodiment

Figure 18A:
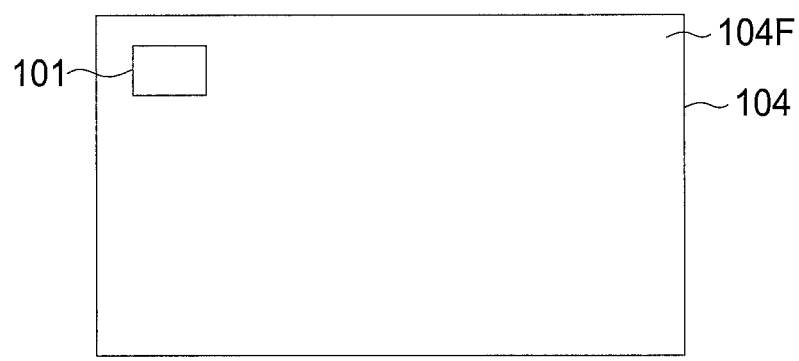
FIGS. 18A and 18B show the structures according to the fourteenth embodiment.
Figure 18B:
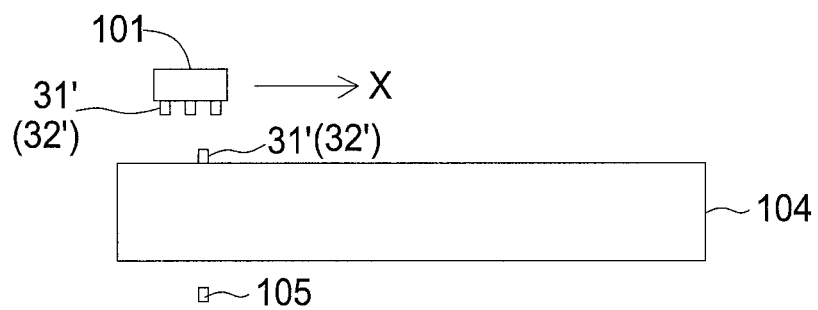

FIG. 18A shows the top view of the substrate 104 and the substrate 101, wherein the area of the substrate 104 may be larger than the area of the substrate 101 according to the present embodiment. The substrate 101 with the semiconductor devices 31', 32' is able to be moved along a direction substantially parallel to the front side surface 104F of the substrate 104 as shown in FIG. 18B, and the substrate 101 and the picking unit 105 may coordinate their moving path and moving speed for transferring all of or some of the semiconductor devices 31', 32' from the substrate 101 to the substrate 104.

Application Embodiment

Figure 19:
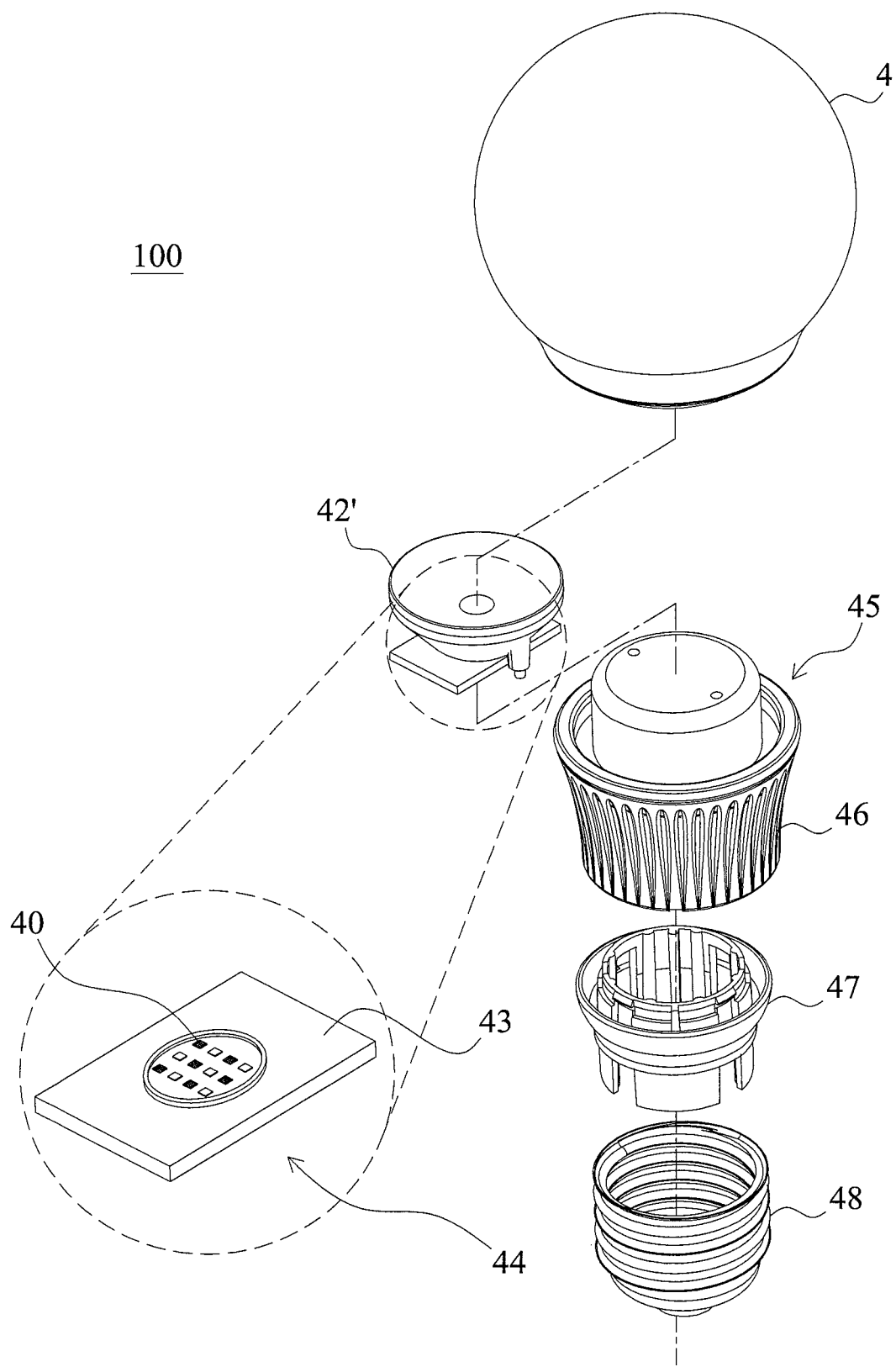
FIG. 19 shows an optoelectronic system.

Due to advantages of the semiconductor device and the method in accordance with the foregoing embodiments of the present disclosure, the semiconductor device and the method may be further incorporated within an optoelectronic system such as illumination apparatus, display, projector, or indicator. As shown in FIG. 19, an optoelectronic system 100 includes a cover 41', an optical element 42' in the cover 41', a light-emitting module 44 coupled with the optical element 42', a base 45 having a heat sink 46 for carrying the light-emitting module 44, a connection portion 47, and an electrical connector 48, wherein the connection portion 47 connects to the base 45 and the electrical connector 48. In an embodiment, the connection portion 47 may be integrated with the base 45 which means the connection portion 47 may be a part of the base 45. The light-emitting module 44 has a carrier 43' and a plurality of semiconductor devices 40 disposed on the carrier 43' by the transfer method in accordance with the foregoing embodiments of the present disclosure. The optical element may have a feature comprising refractor, reflector, diffuser, light guide, or the combination thereof, to direct light emitted from the light-emitting devices out of the cover 41' and perform lighting effects according to requirements for different applications of the optoelectronic system 100.

Figure 20:
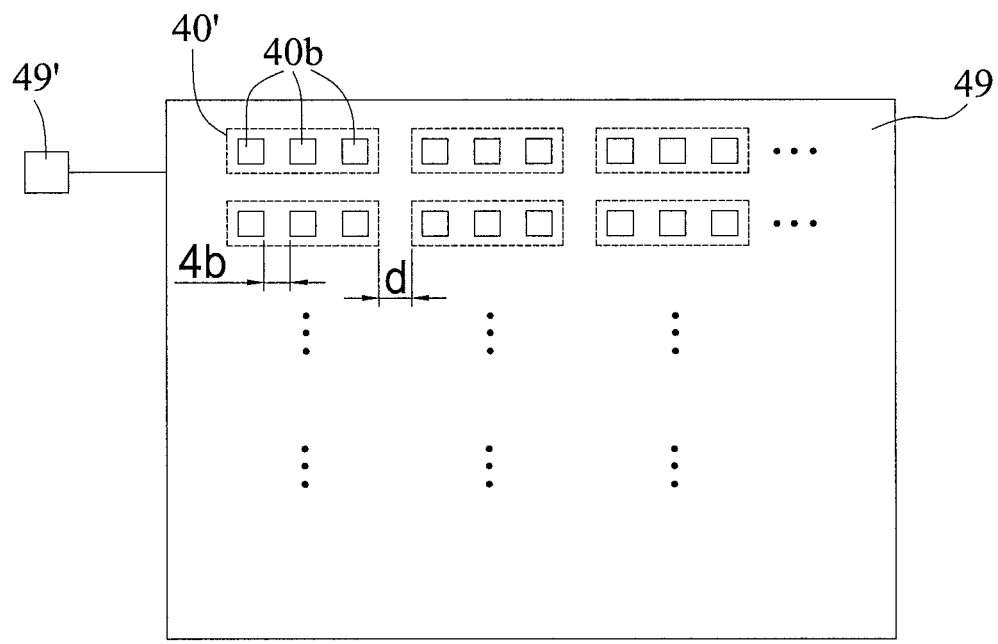
FIG. 20 shows another optoelectronic system.

FIG. 20 illustrates another optoelectronic system 200. The optoelectronic system 200 comprises a board 49, multiple pixels 40' on and electrically connecting the board 49, a control module 49' electrically connecting the board 49 to control the multiple pixel 40', wherein one of the multiple pixels 40' comprises one or more semiconductor devices 40b transferred by the method in accordance with the foregoing embodiments of the present disclosure, and the semiconductor devices 40b can be controlled by the control module 49 the present disclosure, and the semiconductor devices 40b in one pixel 40sd by the control module 49 the present disclosure, and the control module 49' elecht-emitting device for emitting blue light and/or a third light-emitting device for emitting green light. The semiconductor devices 40b may be disposed as a matrix with columns and rows, or be dispersed regularly or irregularly on the board 49. In an embodiment, preferably, a distance d between any two adjacent pixels 40' is between about 100 μm and 5 mm, and a distance d' between any two adjacent semiconductor devices 40b in one pixel 40sas a matrix with columns and rows.

Figure 21:
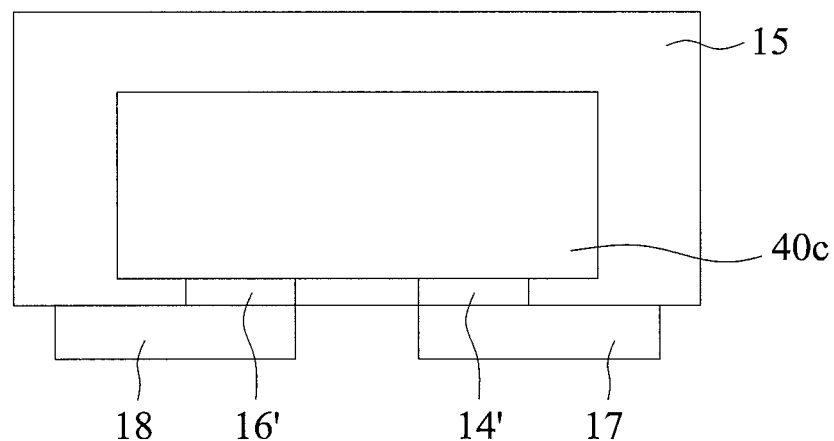
FIG. 21 shows a light-emitting device.

FIG. 21 illustrates a light-emitting device 300. The light-emitting device 300 comprises a semiconductor device 40c in accordance with the foregoing embodiments of the present disclosure, two electrical connecting ends 16', 14' on the light-emitting device 40c, a wavelength conversion layer 15 covering the light-emitting device 40c and exposing the two electrical connecting ends 16', 14', and two bonding pads 17, 18 formed on and respectively connecting the electrical connecting ends 16', 14', wherein the two bonding pads 17, 18 comprises paramagnetic material.

It will be apparent to those having ordinary skill in the art that various modifications, variations or combinations can be made to the embodiments in accordance with the present disclosure without departing from the scope or spirit of the disclosure. In view of the foregoing, it is intended that the present disclosure covers modifications, variations and combinations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A method of transferring semiconductor devices from a first substrate to a second substrate, comprising:
providing the semiconductor devices which are between the first substrate and the second substrate, wherein the semiconductor devices comprises a first semiconductor device and a second semiconductor device, and the first semiconductor device and the second semiconductor device have a first gap between thereof;
providing a picking unit for picking the first semiconductor device and the second semiconductor device from the first substrate;
separating the first semiconductor device and the second semiconductor device from the first substrate;
moving the picking unit and the second substrate relatively to the each other while maintaining a space between the picking unit and the second substrate; and
sticking the first semiconductor device and the second semiconductor device to a surface of the second substrate, wherein the first semiconductor device and the second semiconductor device have a second gap between thereof;
wherein the first gap and the second gap are different.

2. The method according to claim 1, wherein a difference between the first gap and the second gap is smaller than 10 μm.

3. The method according to claim 2, wherein the difference between the first gap and the second gap is larger than 1 nm.

4. The method according to claim 1, wherein the first semiconductor device and the second semiconductor device are separated from the first substrate at the same time.

5. The method according to claim 1, wherein the first semiconductor device and the second semiconductor device are separated from the first substrate in sequence.

6. The method according to claim 1, further comprising moving the first substrate following said moving the picking unit and second substrate.

7. The method according to claim 1, wherein the picking unit provides a magnetic force for attracting the first semiconductor device and the second semiconductor device.

8. The method according to claim 1, wherein each of the first and second semiconductor devices comprises a magnetism layer.

9. The method according to claim 8, wherein the magnetism layer comprises paramagnetic material.

10. The method according to claim 1, wherein the picking unit directly contacts the first semiconductor device and the second semiconductor device after separating the first semiconductor device and the second semiconductor device from the first substrate.

11. The method according to claim 1, wherein the second substrate is between the picking unit and the semiconductor devices.

12. The method according to claim 7, further comprising a plurality of terminals are on the surface of the second substrate.

13. The method according to claim 12, wherein the plurality of terminals comprise paramagnetic material.

14. The method according to claim 7, further comprising a sacrificial layer is-between the first semiconductor device and the first substrate.

15. The method according to claim 14, further comprising a release layer between the first semiconductor device and the first substrate.

16. The method according to claim 14, further comprising removing the sacrificial layer.

17. The method according to claim 15, wherein an adhesive strength between the release layer and the first semiconductor device is smaller than the magnetic force.

18. The method according to claim 7, wherein the picking unit comprises an electromagnet circuit for providing the magnetic force.

\* \* \* \* \*